(12) United States Patent
Sakaguchi et al.

(10) Patent No.: US 10,991,431 B2
(45) Date of Patent: Apr. 27, 2021

(54) SEMICONDUCTOR MEMORY DEVICE

(71) Applicant: TOSHIBA MEMORY CORPORATION, Minato-ku (JP)

(72) Inventors: Yuki Sakaguchi, Yokohama (JP); Tatsuo Izumi, Yokohama (JP); Masashi Yoshida, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/569,379

(22) Filed: Sep. 12, 2019

(65) Prior Publication Data
US 2020/0286564 A1 Sep. 10, 2020

(30) Foreign Application Priority Data
Mar. 7, 2019 (JP) .............................. JP2019-041174

(51) Int. Cl.
| | |
|---|---|
| *G11C 16/14* | (2006.01) |
| *G11C 16/04* | (2006.01) |
| *G11C 16/32* | (2006.01) |
| *H01L 27/1157* | (2017.01) |
| *H01L 27/11524* | (2017.01) |
| *H01L 27/11565* | (2017.01) |
| *H01L 27/11519* | (2017.01) |

(52) U.S. Cl.
CPC .......... *G11C 16/14* (2013.01); *G11C 16/0483* (2013.01); *G11C 16/32* (2013.01); *H01L 27/1157* (2013.01); *H01L 27/11519* (2013.01); *H01L 27/11524* (2013.01); *H01L 27/11565* (2013.01)

(58) Field of Classification Search
CPC ...... G11C 16/14; G11C 16/0483; G11C 16/32
USPC ..................................................... 365/185.29
See application file for complete search history.

(56) References Cited

U.S. PATENT DOCUMENTS

| | | | |
|---|---|---|---|
| 9,711,226 B2 | 7/2017 | Maejima | |
| 9,916,901 B1 | 3/2018 | Saito et al. | |
| 10,223,199 B2 | 3/2019 | Hahn et al. | |
| 2012/0134210 A1* | 5/2012 | Maeda ................... | G11C 16/08 365/185.11 |

(Continued)

FOREIGN PATENT DOCUMENTS

| | | |
|---|---|---|
| JP | 2016-171243 A | 9/2016 |
| TW | 201633316 A | 9/2016 |
| TW | 201842507 A | 12/2018 |

*Primary Examiner* — Anthan Tran
(74) *Attorney, Agent, or Firm* — Oblon, McClelland, Maier & Neustadt, L.L.P.

(57) ABSTRACT

A semiconductor memory device includes a first wiring, a first memory transistor connected to the first wiring, a first transistor connected between the first wiring and the first memory transistor, a second transistor connected between the first wiring and the first transistor, and second to fourth wirings respectively connected to gate electrodes of the first memory transistor, the first transistor, and the second transistor. From a first timing to a second timing, a voltage difference between the first wiring and the third wiring is maintained at a predetermined value, a voltage difference between the third wiring and the fourth wiring is maintained at a predetermined value, a voltage of the first wiring becomes larger than a voltage of the third wiring, and the voltage of the third wiring becomes larger than a voltage of the fourth wiring.

20 Claims, 29 Drawing Sheets

(56) References Cited

U.S. PATENT DOCUMENTS

| | | | |
|---|---|---|---|
| 2012/0224424 A1* | 9/2012 | Lee | G11C 16/10 |
| | | | 365/185.05 |
| 2013/0229871 A1* | 9/2013 | Li | H01L 29/7926 |
| | | | 365/185.11 |
| 2016/0268304 A1 | 9/2016 | Ikeda et al. | |
| 2018/0075908 A1 | 3/2018 | Hagishima | |
| 2018/0277555 A1 | 9/2018 | Fukushima et al. | |
| 2018/0322045 A1 | 11/2018 | Sakui | |

* cited by examiner

SEMICONDUCTOR MEMORY DEVICE

CROSS-REFERENCE TO RELATED APPLICATIONS

This application is based upon and claims the benefit of Japanese Patent Application No. 2019-041174, filed on Mar. 7, 2019, the entire contents of which are incorporated herein by reference.

BACKGROUND

Field

Embodiments described herein relate generally to a semiconductor memory device.

Description of the Related Art

There has been known a semiconductor memory device including a first wiring, a first memory transistor connected to the first wiring, a first transistor connected between the first wiring and the first memory transistor, a second wiring connected to a gate electrode of the first memory transistor, and a third wiring connected to a gate electrode of the first transistor.

DETAILED DESCRIPTION

Figure 1:
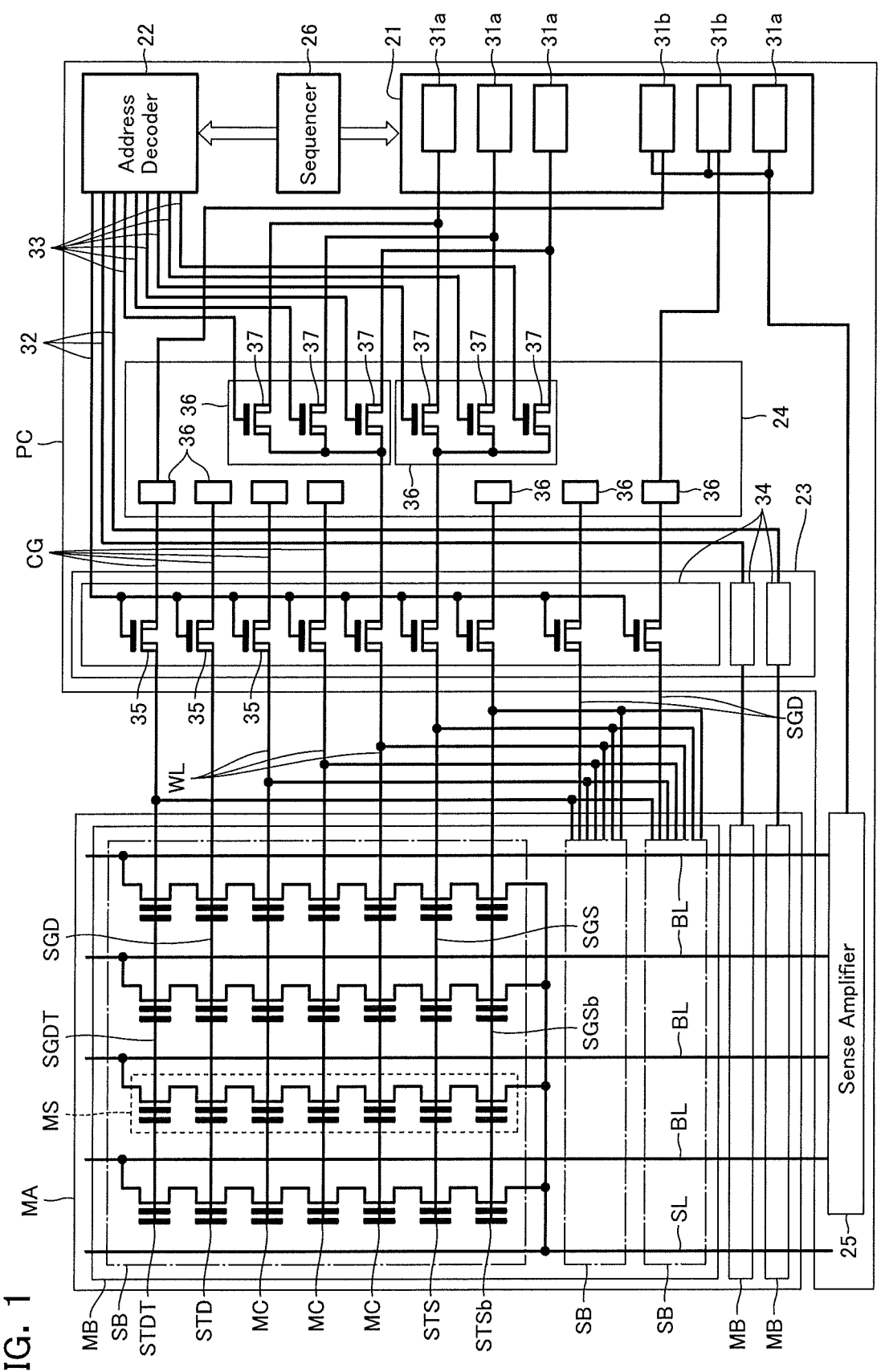
FIG. 1 is a schematic block diagram illustrating a configuration of a semiconductor memory device according to a first embodiment.

A semiconductor memory device according to one embodiment includes a first wiring, a first memory transistor connected to the first wiring, a first transistor connected between the first wiring and the first memory transistor, a second transistor connected between the first wiring and the first transistor, a second wiring connected to a gate electrode of the first memory transistor, a third wiring connected to a gate electrode of the first transistor, a fourth wiring connected to a gate electrode of the second transistor, and a control circuit configured to execute an erase operation that erases data of the first memory transistor. From a first timing of the erase operation to a second timing after the first timing, the control circuit maintains a voltage difference between the first wiring and the third wiring at a predetermined value, maintains a voltage difference between the third wiring and the fourth wiring at a predetermined value, controls a voltage of the first wiring to become larger than a voltage of the third wiring, and controls the voltage of the third wiring to become larger than a voltage of the fourth wiring.

In a data erase method for a semiconductor memory device according to one embodiment, the semiconductor memory device includes a first wiring, a first memory transistor connected to the first wiring, a first transistor connected between the first wiring and the first memory transistor, a second transistor connected between the first wiring and the first transistor, a second wiring connected to a gate electrode of the first memory transistor, a third wiring connected to a gate electrode of the first transistor, a fourth wiring connected to a gate electrode of the second transistor, and a control circuit configured to execute an erase operation that erases data of the first memory transistor. The data erase method includes, from a first timing of the erase operation to a second timing after the first timing, by the control circuit: maintaining a voltage difference between the first wiring and the third wiring at a predetermined value; maintaining a voltage difference between the third wiring and the fourth wiring at a predetermined value; controlling a voltage of the first wiring to become larger than a voltage of the third wiring; and controlling the voltage of the third wiring to become larger than a voltage of the fourth wiring.

Next, semiconductor memory devices according to embodiments are described in detail with reference to the accompanying drawings. Here, the following embodiments are only examples, and are not described for the purpose of limiting the present invention. The following drawings are schematic, and for sake of convenient description, apart of configurations and the like are sometimes omitted. Identical portions in a plurality of embodiments are attached by identical reference numerals and their descriptions may be omitted.

In this specification, when referring to "the semiconductor memory device," it may mean a memory die or may mean a memory system including a control die, such as a memory chip, a memory card, and an SSD. Further, it may mean a configuration including a host computer such as a smartphone, a tablet device, and a personal computer.

In this specification, when referring to that a first configuration "is electrically connected" to a second configuration, the first configuration may be directly connected to the second configuration, or the first configuration may be connected to the second configuration via wiring, a semiconductor member, a transistor, or the like. For example, when three transistors are connected in series, even if the second transistor is in an OFF state, the first transistor is "electrically connected" to the third transistor.

In this specification, when referring to that the first configuration "is connected between" the second configuration and a third configuration, it may mean that the first configuration, the second configuration, and the third configuration are connected in series and the first configuration is disposed on a current path between the second configuration and the third configuration.

In this specification, when referring to that a circuit or the like "electrically conducts" two wirings or the like, it may mean, for example, that this circuit or the like includes a transistor or the like, this transistor or the like is disposed on a current path between the two wirings, and this transistor or the like turns ON.

First Embodiment

[Configuration]

Next, with reference to drawings, a configuration of a semiconductor memory device according to a first embodiment is described.

FIG. 1 is a schematic equivalent circuit diagram illustrating a configuration of a semiconductor memory device according to a first embodiment.

The semiconductor memory device according to the embodiment includes a memory cell array MA and a peripheral circuit PC that controls the memory cell array MA.

The memory cell array MA includes a plurality of memory blocks MB. These plurality of memory blocks MB each include a plurality of subblocks SB. These plurality of subblocks SB each include a plurality of memory strings MS. These plurality of memory strings MS have one ends each connected to the peripheral circuit PC via a bit line BL. These plurality of memory strings MS have other ends each connected to the peripheral circuit PC via a common source line SL.

The memory string MS includes a drain select transistor STDT, a drain select transistor STD, a plurality of memory cells MC, a source select transistor STS, and a source select transistor STSb, which are connected in series between the bit line BL and the source line SL. Hereinafter, the drain select transistor STDT, the drain select transistor STD, the source select transistor STS, and the source select transistor STSb may be simply referred to as, for example, select transistors (STDT, STD, STS, STSb).

The memory cell MC is a field-effect type transistor (memory transistor) including a semiconductor layer that functions as a channel region, a gate insulating film including an electric charge accumulating film, and a gate electrode. The memory cell MC has a threshold voltage that varies corresponding to an electric charge amount in the electric charge accumulating film. The respective gate electrodes of the plurality of memory cells MC corresponding to one memory string MS are connected to word lines WL. These respective word lines WL are commonly connected to all the memory strings MS in one memory block MB.

The select transistor (STDT, STD, STS, STSb) is a field-effect type transistor including a semiconductor layer that functions as a channel region, a gate insulating film, and a gate electrode. The respective gate electrodes of the select transistors (STDT, STD, STS, STSb) are connected to select gate lines (SGDT, SGD, SGS, SGSb). The drain select line SGDT is commonly connected to all the memory strings MS in one memory block MB. The drain select line SGD is disposed corresponding to the subblock SB and commonly connected to all the memory strings MS in one subblock SB. The source select line SGS and the source select line SGSb are commonly connected to all the memory strings MS in the plurality of subblocks SB in one memory block MB.

The peripheral circuit PC includes an operating voltage generation circuit 21 that generates operating voltages, an address decoder 22 that decodes address data, a block select circuit 23 and a voltage select circuit 24 that transfer the operating voltage to the memory cell array MA corresponding to an output signal of the address decoder 22, a sense amplifier 25 connected to the bit lines BL, and a sequencer 26 that controls them.

The operating voltage generation circuit 21 sequentially generates a plurality of operating voltages applied to the bit line BL, the source line SL, the word line WL, and the select gate lines (SGDT, SGD, SGS, SGSb) in a read operation, a write operation, and an erase operation for the memory cell array MA, in response to a control signal from the sequencer 26 to output the operating voltages to a plurality of operating voltage output terminals.

The operating voltage generation circuit 21 includes, for example, a plurality of charge pump circuits 31a and a plurality of regulator circuits 31b. The charge pump circuits 31a and the regulator circuits 31b include respective operating voltage output terminals.

The charge pump circuit 31a, for example, outputs a voltage larger than a power supply voltage to the operating voltage output terminal in response to a clock signal. When the voltage of the operating voltage output terminal of the charge pump circuit 31a is smaller than a predetermined voltage, the clock signal is input to the charge pump circuit 31a.

Accordingly, the voltage of the operating voltage output terminal increases to the predetermined voltage. Meanwhile, when the voltage of the operating voltage output terminal of the charge pump circuit 31a is larger than the predetermined voltage, the clock signal is not input to the charge pump circuit 31a. Accordingly, the voltage of the operating voltage output terminal decreases down to the predetermined voltage. The voltages of the operating voltage output terminals of the charge pump circuits 31a are controllable by, for example, the sequencer 26.

The regulator circuit 31b is connected to, for example, the operating voltage output terminal of the charge pump circuit 31a. When the output voltage of the charge pump circuit 31a is sufficiently large, the output voltage of the regulator circuit 31b becomes a voltage decreased by a certain voltage from the output voltage of the charge pump circuit 31a. Meanwhile, when the output voltage of the charge pump circuit 31a is smaller than this certain voltage, the output voltage of the regulator circuit 31b has a magnitude to the extent of approximately a ground voltage $V_{SS}$.

In this embodiment, two or more regulator circuits 31b are connected to the operating voltage output terminals of the predetermined charge pump circuits 31a which is connectable to the bit line BL via the sense amplifier 25. One operating voltage output terminal of these two or more regulator circuits 31b is connected to the drain select line SGD, and the other operating voltage output terminal is connected to the drain select line SGDT.

The address decoder 22 includes a plurality of block select lines 32 and a plurality of voltage select lines 33. For example, the address decoder 22 sequentially refers to address data of an address register in response to the control signal from the sequencer 26, decodes this address data to cause the predetermined block select line 32 and voltage select line 33 corresponding to the address data to be in a state of "H," and cause the block select lines 32 and the voltage select lines 33 other than the above to be in a state of "L."

The block select circuit 23 includes a plurality of block selectors 34 that correspond to the memory blocks MB. These plurality of block selectors 34 each include a plurality of block select transistors 35 corresponding to the word lines WL and the select gate lines (SGDT, SGD, SGS, SGSb). The block select transistor 35 is, for example, a field-effect type high voltage transistor. The block select transistors 35 have one ends each electrically connected to the corresponding word line WL or select gate line (SGDT, SGD, SGS, SGSb). The other ends are each electrically connected to the operating voltage output terminal of the charge pump circuit 31a or the regulator circuit 31b via the wiring CG and the voltage select circuit 24. The gate electrodes are commonly connected to the corresponding block select line 32.

The voltage select circuit 24 includes a plurality of voltage selectors 36 corresponding to the word line WL and the select gate line (SGDT, SGD, SGS, SGSb). These plurality of voltage selectors 36 each includes a plurality of voltage select transistors 37. The voltage select transistor 37 is, for example, a field-effect type high voltage transistor. The voltage select transistors 37 have one ends that are each electrically connected to the corresponding word line WL or the select gate line (SGDT, SGD, SGS, SGSb) via the wiring CG and the block select circuit 23. The other ends are each electrically connected to the corresponding operating voltage output terminal. The gate electrodes are each connected to the corresponding voltage select line 33.

The sense amplifier 25 is connected to a plurality of the bit lines BL. The sense amplifier 25 includes, for example, a plurality of sense amplifier units corresponding to the bit lines BL. The sense amplifier units each include a clamp transistor that charges the bit line BL based on the voltage generated in the operating voltage generation circuit 21, a sense circuit that senses the voltage or the current of the bit line BL, a plurality of latches that hold output signals, write data, verify pass flags, and the like of this sense circuit, and a logic circuit. The logic circuit identifies data held in the memory cell MC by referring to data on a lower page held by the latch in, for example, the read operation. The logic circuit controls the voltage of the bit line BL by referring to data on a lower page held by the latch in, for example, the write operation.

The sequencer 26 outputs control signals to the operating voltage generation circuit 21, the address decoder 22, and the sense amplifier 25, corresponding to input instructions and states of the semiconductor memory device. For example, the sequencer 26 sequentially refers to command data of the command register in response to the clock signal, decodes this command data, and outputs the decoded data as the control signals to the operating voltage generation circuit 21, the address decoder 22, and the sense amplifier 25.

Figure 2:
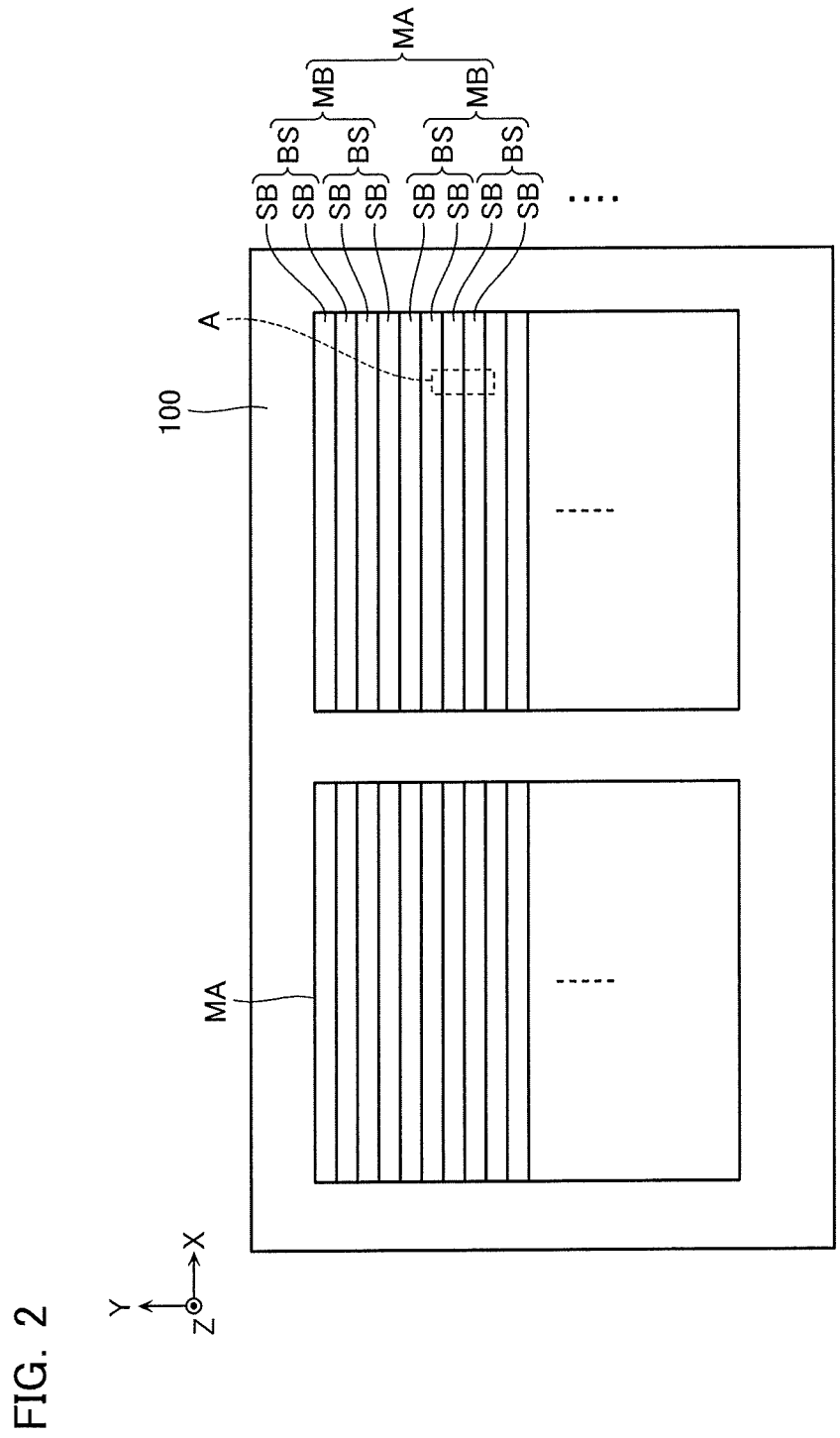
FIG. 2 is a schematic plan view illustrating the configuration of the semiconductor memory device.

FIG. 2 is a schematic plan view of the semiconductor memory device according to the embodiment. As illustrated in FIG. 2, the semiconductor memory device according to the embodiment includes a semiconductor substrate 100. In the example in drawing, the semiconductor substrate 100 includes two memory cell arrays MA arranged in an X direction. The memory cell array MA includes a plurality of memory blocks MB arranged in a Y direction. The memory block MB includes two block structures BS arranged in the Y direction. The block structure BS includes two subblocks SB arranged in the Y direction.

Figure 3:
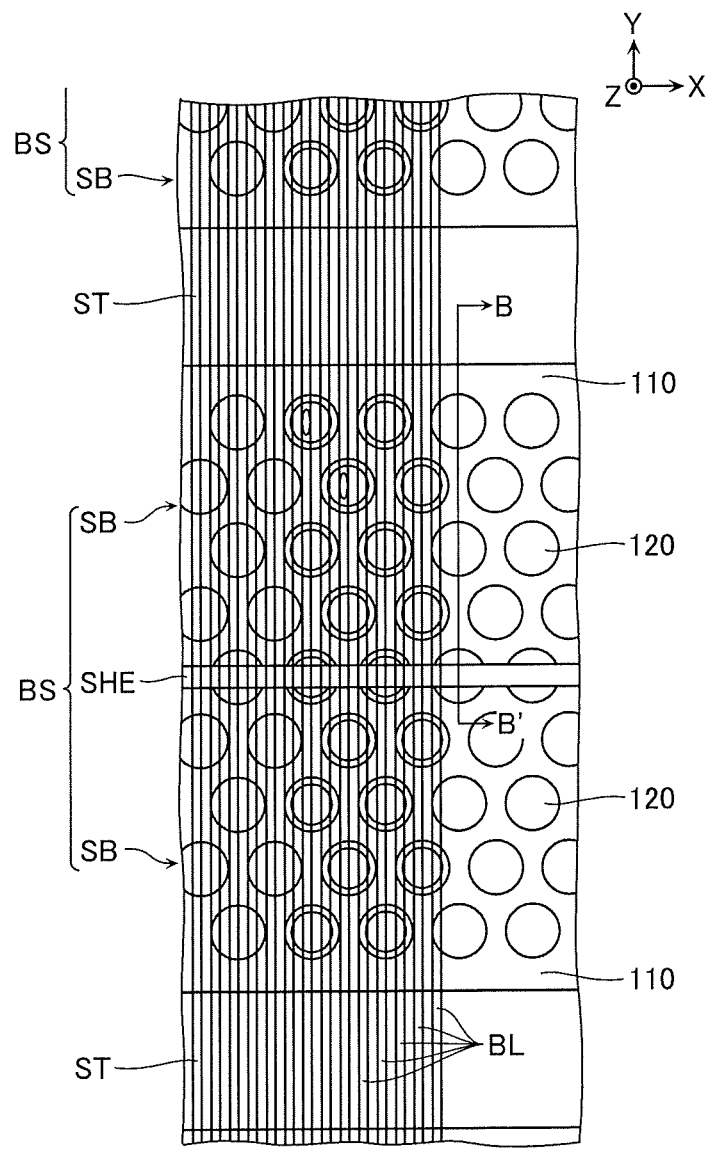
FIG. 3 is an enlarged view of a part indicated by A in FIG. 2.

FIG. 3 is a schematic enlarged view of a portion indicated by A in FIG. 2. As illustrated in FIG. 3, an inter-block structure insulating layer ST extending in the X direction is disposed between the two block structures BS arranged in the Y direction. The block structure BS includes a conducting layer 110 that extends in the X direction and a plurality of semiconductor layers 120 arranged in a predetermined pattern in the X direction and the Y direction. Between the two subblocks SB arranged in the Y direction, an inter-subblock insulating layer SHE that extends in the X direction is disposed. The inter-subblock insulating layer SHE separates some of the conducting layers 110 and some of the semiconductor layers 120 in the Y direction. FIG. 3 illustrates the plurality of bit lines BL that are arranged in the X direction and extend in the Y direction. These plurality of bit lines BL are each connected to one semiconductor layer 120 included in each of the subblocks SB.

Figure 4:
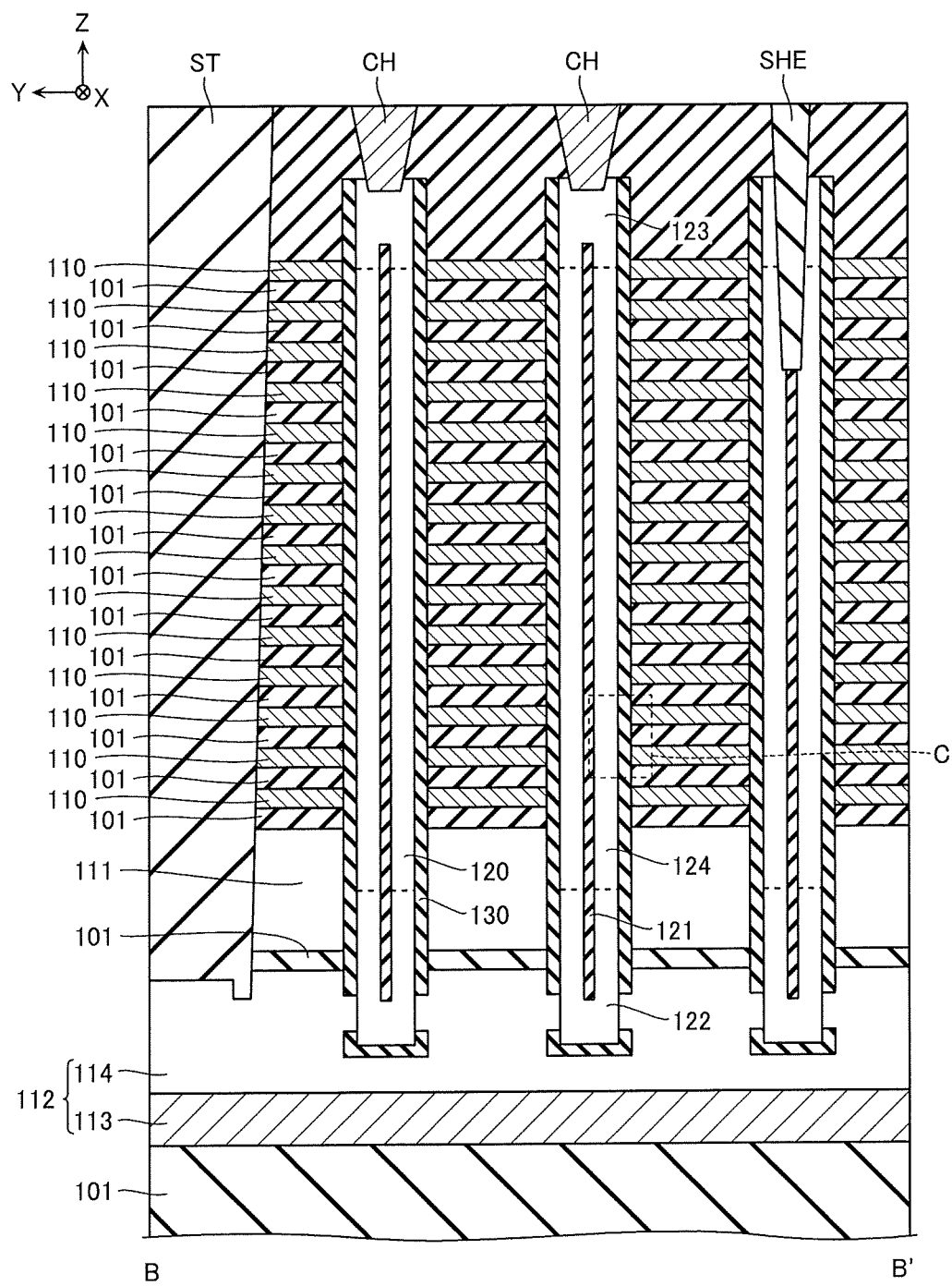
FIG. 4 is a cross-sectional view taken along a line B-B' of a structure illustrated in FIG. 3 viewed in an arrow direction.
Figure 5:
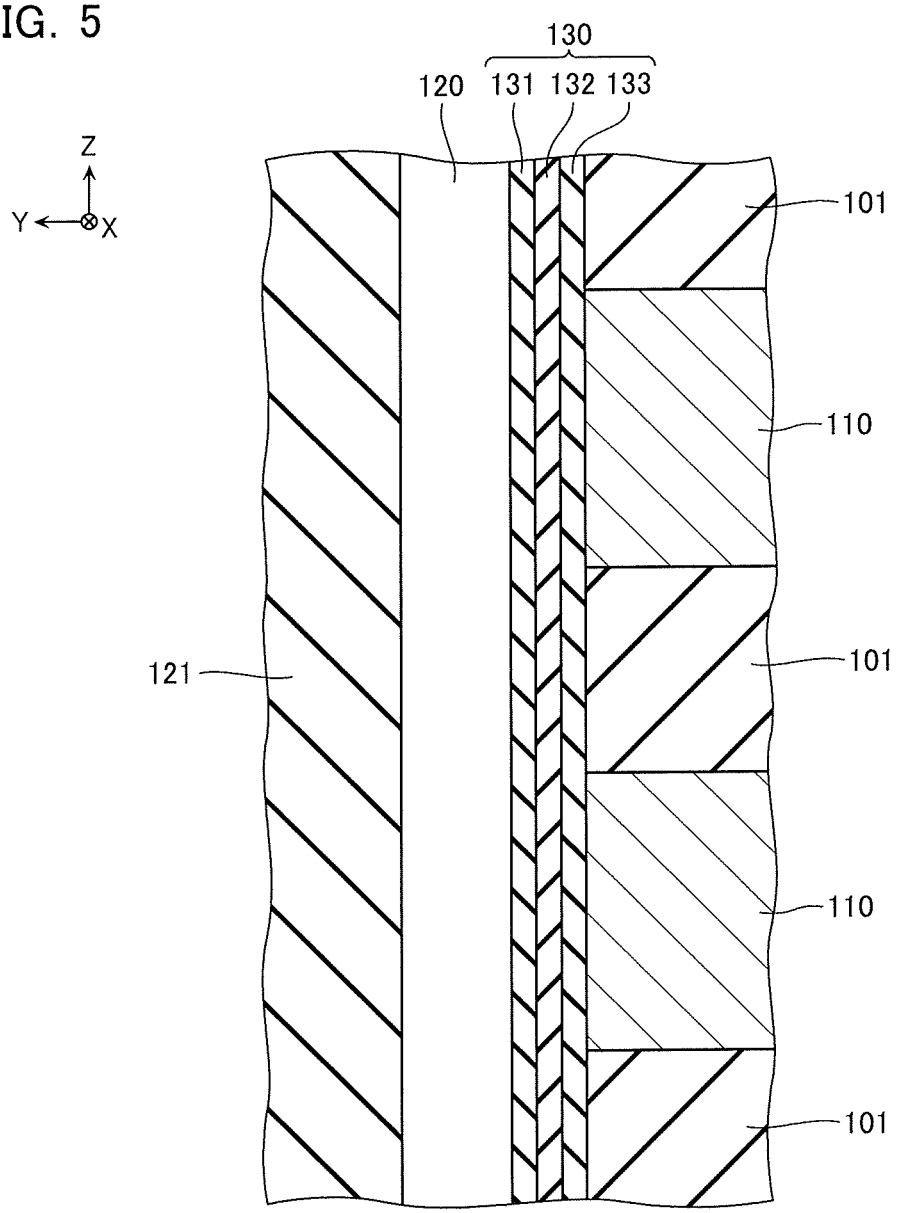
FIG. 5 is an enlarged view of a part indicated by C in FIG. 4.

FIG. 4 is a schematic cross-sectional view taken along a line B-B' of the structure illustrated in FIG. 3 viewed in an arrow direction. FIG. 5 is a schematic enlarged view of a portion indicated by C in FIG. 4.

As illustrated in FIG. 4, the block structure BS includes a plurality of the conducting layers 110 arranged in a Z direction, the plurality of semiconductor layers 120 that extend in the Z direction, and a plurality of gate insulating films 130 each disposed between the plurality of conducting layers 110 and the plurality of semiconductor layers 120.

The conducting layer 110 functions as the gate electrodes of the memory cells and the word line WL, and the like, as is mentioned later. The conducting layer 110 is an approximately plate-shaped conducting layer extending in the X direction. The conducting layer 110, for example, may include a laminated film or the like of titanium nitride (TiN) and tungsten (W) or may include polycrystalline silicon or the like containing impurities of phosphorus (P), boron (B), or the like. Between the plurality of conducting layers 110 arranged in the Z direction, insulating layers 101 of silicon oxide ($SiO_2$) or the like are disposed.

Under the conducting layer 110, a conducting layer 111 is disposed. The conducting layer 111 functions as the gate electrodes of the source select transistors STSb and the source select line SGSb. The conducting layer 111 may, for example, include polycrystalline silicon or the like containing impurities of phosphorus (P) or the like. Between the conducting layer 111 and the conducting layer 110, the insulating layer 101 of silicon oxide ($SiO_2$) or the like is disposed.

Under the conducting layer 111, a conducting layer 112 is disposed. The conducting layer 112 functions as the source line SL. The conducting layer 112 may, for example, include a conducting layer 113 including metal such as tungsten silicide (WSi) and a conducting layer 114 of polycrystalline silicon or the like containing N-type impurities of phosphorus (P) or the like. Between the conducting layer 112 and the conducting layer 111, the insulating layer 101 of silicon oxide ($SiO_2$) or the like is disposed.

The semiconductor layer 120 functions as a channel region of the plurality of memory cells MC and the select transistors (STDT, STD, STS, STSb) included in one memory string MS (FIG. 1). The semiconductor layer 120 is, for example, a semiconductor layer of polycrystalline silicon (Si) or the like. The semiconductor layer 120 has, for example, an approximately closed-bottomed cylindrical shape and includes an insulating film 121 of silicon oxide or the like at a center part. Respective outer peripheral surfaces of the semiconductor layers 120 are surrounded by the conducting layers 110.

The semiconductor layer 120 has a lower end portion and an upper end portion on which impurity regions 122 and 123 containing N-type impurities of phosphorus (P) or the like are disposed. Between the impurity regions 122 and 123, a non-dope region 124 having an impurity concentration less than those of these impurity regions 122 and 123 is disposed. The impurity region 122 is connected to the conducting layer 114 and is opposed to the conducting layer 111. The non-dope region 124 is opposed to the conducting layer 111 and all the conducting layers 110 arranged in the Z direction. The impurity region 123 is connected to the bit line BL (FIG. 3) via a contact CH and opposed to the conducting layer 110 disposed on the uppermost side.

The gate insulating film 130 has a shape of an approximately closed-bottomed cylindrical shape that covers an outer peripheral surface and a lower end of the semiconductor layer 120. However, the gate insulating film 130 is not disposed in a connecting portion between the semiconductor layer 120 and the conducting layer 114.

The gate insulating film 130 includes, for example, as illustrated in FIG. 5, a tunnel insulating film 131, an electric charge accumulating film 132, and a block insulating film 133, which are laminated between the semiconductor layer 120 and the conducting layer 110. The tunnel insulating film 131 and the block insulating film 133 are, for example, insulating films of silicon oxide ($SiO_2$) or the like. The electric charge accumulating film 132 is, for example, a film configured to accumulate the electric charge of silicon nitride ($Si_3N_4$) or the like. The tunnel insulating film 131, the electric charge accumulating film 132, and the block insulating film 133, which have approximately cylindrical shapes, extends in the Z direction along the outer peripheral surface of the semiconductor layer 120.

FIG. 5 has shown an example in which the gate insulating film 130 includes the electric charge accumulating film 132 of silicon nitride or the like. However, the gate insulating film 130 may, for example, include a floating gate of polycrystalline silicon or the like containing N-type or P-type impurities.

Figure 6:
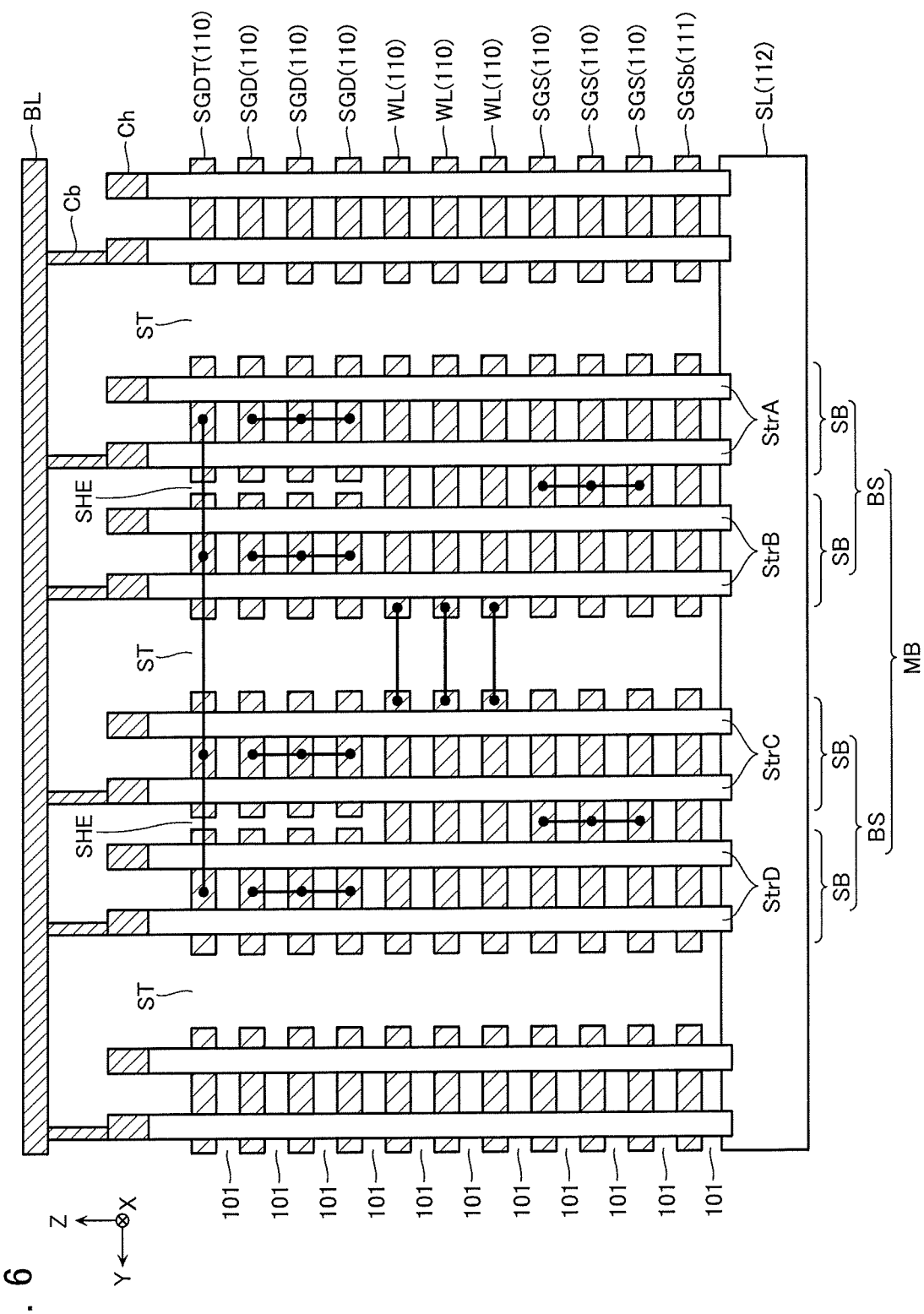
FIG. 6 is a schematic cross-sectional view illustrating the configuration of the semiconductor memory device according to the first embodiment.

FIG. 6 is a schematic cross-sectional view of the semiconductor memory device according to the embodiment.

As illustrated in FIG. 6, among the plurality of conducting layers 110 arranged in the Z direction, the plurality of conducting layers 110 positioned in the lowermost layer function as the source select lines SGS (FIG. 1) and the gate electrodes of the plurality of source select transistors STS connected to those. In the example in drawing, the plurality of source select lines SGS arranged in the Z direction via the insulating layers 101 are electrically connected to one another. The plurality of source select lines SGS arranged in the Y direction via the inter-block structure insulating layer ST are electrically insulated from one another.

The plurality of conducting layers 110 positioned above this function as the word lines WL (FIG. 1) and the gate electrodes of the plurality of memory cells MC (FIG. 1) connected to these. In the example in drawing, the plurality of word lines WL arranged in the Z direction via the insulating layers 101 are electrically insulated from one another. The two word lines WL included in one memory block MB and arranged in the Y direction via the inter-block structure insulating layer ST are electrically connected to one another.

The plurality of conducting layers 110 positioned above this function as the drain select line SGD and the gate electrodes of the plurality of drain select transistors STD (FIG. 1) connected to this. In the example in drawing, the plurality of drain select lines SGD arranged in the Z direction via the insulating layers 101 are electrically connected to one another. The two drain select lines SGD arranged in the Y direction via the inter-block structure insulating layers ST are electrically insulated from one another. Similarly, the two drain select lines SGD arranged in the Y direction via the inter-subblock insulating layers SHE are electrically insulated from one another.

One conducting layer 110 positioned in the uppermost side functions as the drain select line SGDT and the gate electrodes of the plurality of drain select transistors STDT (FIG. 1) connected to this. In the example in drawing, the four drain select lines SGDT included in one memory block MB and arranged in the Y direction via the inter-block structure insulating layers ST or the inter-subblock insulating layers SHE are electrically connected to one another.

In the example in drawing, the memory block MB includes four subblocks SB. Hereinafter, the respective memory strings MS (FIG. 1) included in these four subblocks SB may be referred to as a string StrA, a string StrB, a string StrC, and a string StrD.

[Read Operation]

Figure 7:
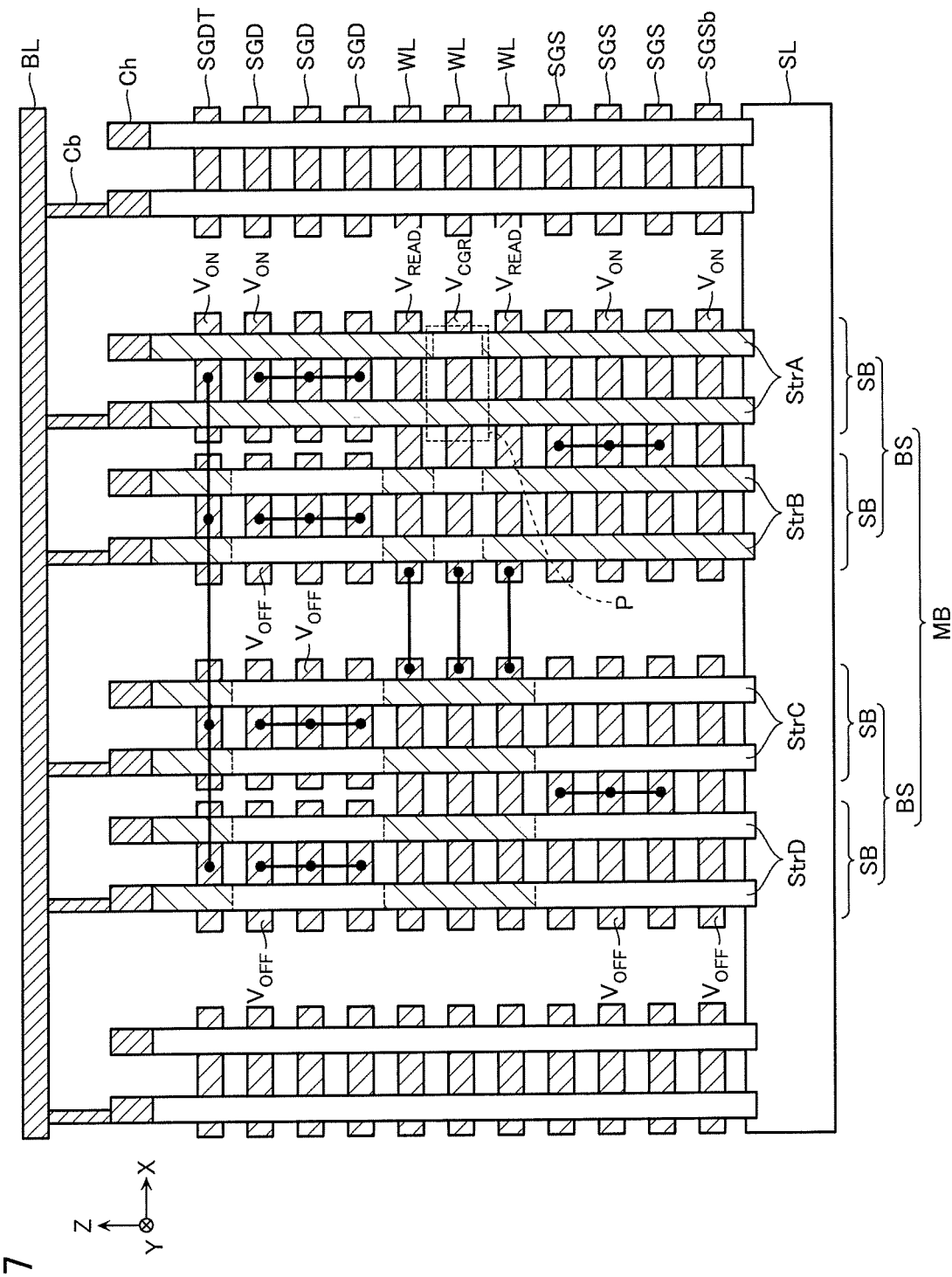
FIG. 7 is a schematic cross-sectional view for describing a read operation.

FIG. 7 is a schematic cross-sectional view for describing a read operation of the semiconductor memory device according to the embodiment. In FIG. 7, a description will be given of an example in which a read operation is executed with respect to a selected page P corresponding to a string StrA.

In the read operation, for example, the plurality of selected memory cells MC included in the selected page P are selectively electrically conducted with the bit lines BL and the source lines SL. For example, the select gate lines (SGDT, SGD, SGS, SGSb) corresponding to the strings StrA are supplied with an ON voltage $V_{ON}$ to turn ON the plurality of select transistors (STDT, STD, STS, STSb). The drain select line SGD corresponding to a string StrB and the select gate lines (SGD, SGS, SGSb) corresponding to a string StrC, a string StrD are supplied with an OFF voltage $V_{OFF}$ to turn OFF the select transistors (STD, STS, STSb). The read pass voltage $V_{READ}$ is supplied to non-selected word lines WL corresponding to non-selected pages to turn ON every memory cell MC connected to the non-selected word line WL.

The ON voltage $V_{ON}$ is a voltage having a magnitude to the extent that a channel of the electrons is formed on a surface of the semiconductor layer 120. The OFF voltage $V_{OFF}$ is a voltage having a magnitude to the extent that the channel is not formed on the surface of the semiconductor layer 120. The read pass voltage $V_{READ}$ is a voltage having a magnitude to the extent that the channel of the electrons is formed on the surface of the semiconductor layer 120 regardless of data stored in the memory cell MC.

In the read operation, for example, a read voltage $V_{CGR}$ is supplied to the selected word line WL corresponding to the selected page P. The read voltage $V_{CGR}$ is a voltage having a magnitude to the extent that a channel of the electrons is formed on a surface of the memory cell MC corresponding to data stored in the memory cell MC, that is, a threshold voltage of the memory cell MC.

In the read operation, for example, a predetermined voltage difference is supplied between the bit line BL and the source line SL, and the current or the voltage of the bit line BL is sensed by the sense amplifier 25 (FIG. 1).

[Write Operation]

Figure 8:
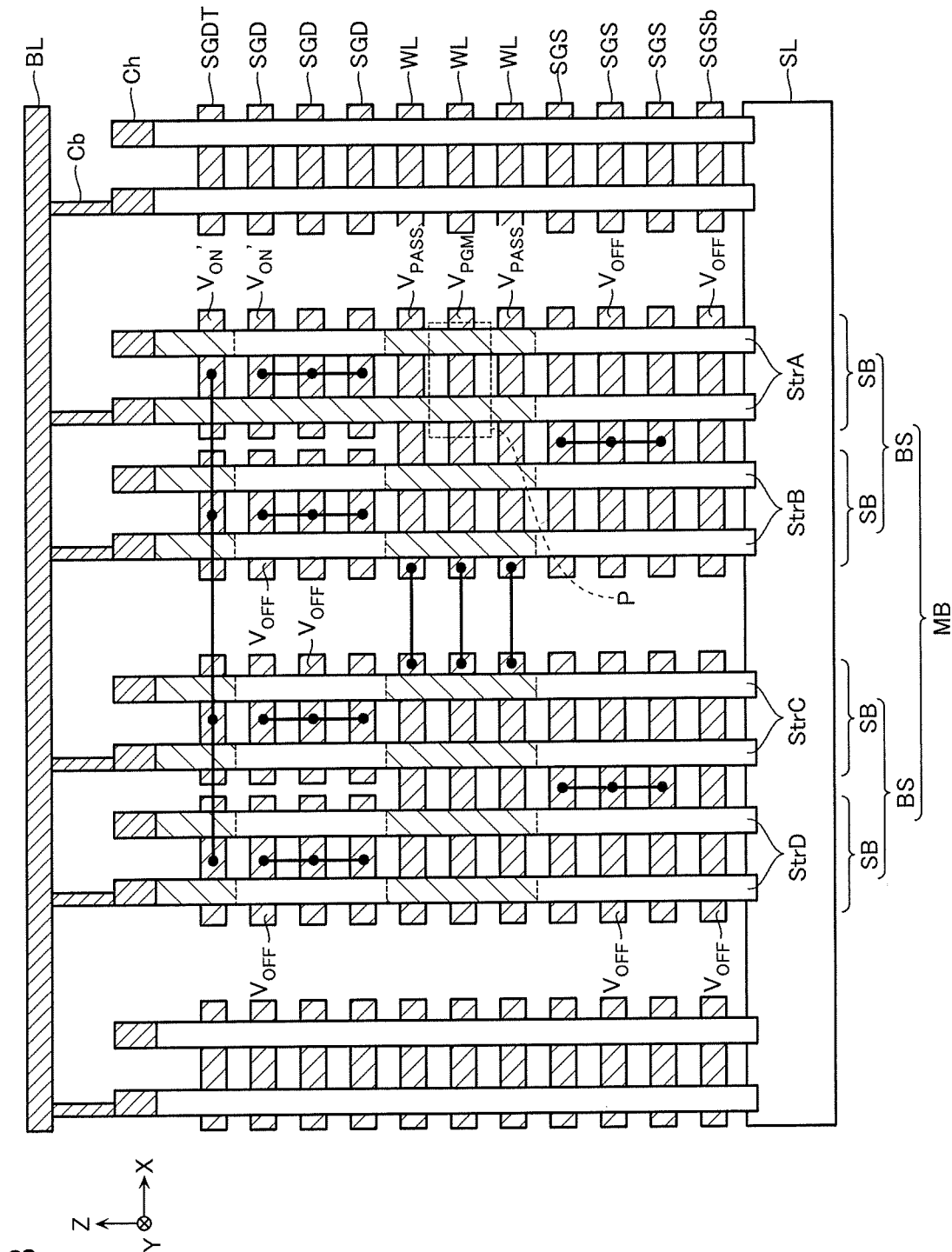
FIG. 8 is a schematic cross-sectional view for describing a write operation.

FIG. 8 is a schematic cross-sectional view for describing a write operation of the semiconductor memory device according to the embodiment.

In the write operation, for example, the ground voltage $V_{SS}$ is supplied to the bit line BL connected to the memory cell MC whose threshold voltage is adjusted. On the other hand, an inhibit voltage is supplied to the bit line BL connected to the memory cell MC whose threshold voltage is not adjusted. The inhibit voltage is larger than the ground voltage $V_{SS}$.

In the write operation, for example, the memory cell MC whose threshold voltage is adjusted is selectively electrically conducted with the bit line BL. For example, the drain select line SGDT and the drain select line SGD corresponding to the string StrA are supplied with an ON voltage $V_{ON'}$, and the drain select lines SGD corresponding to the strings StrB, StrC, StrD are supplied with the OFF voltage $V_{OFF}$. The ON voltage $V_{ON'}$ may be smaller than, for example, the ON voltage $V_{ON}$ of FIG. 7. The non-selected word line WL corresponding to the non-selected page is supplied with a write pass voltage $V_{PASS}$. The write pass voltage $V_{PASS}$ may be larger than, for example, the read pass voltage $V_{READ}$ of FIG. 7.

In the write operation, for example, the selected word line WL is supplied with a program voltage $V_{PGM}$. The program voltage $V_{PGM}$ is larger than the write pass voltage $V_{PASS}$. Thus, the electrons are accumulated on the electric charge accumulating film 132 (FIG. 5) of the desired memory cell MC to increase the threshold voltage of the memory cell MC.

[Erase Operation]

Figure 9:
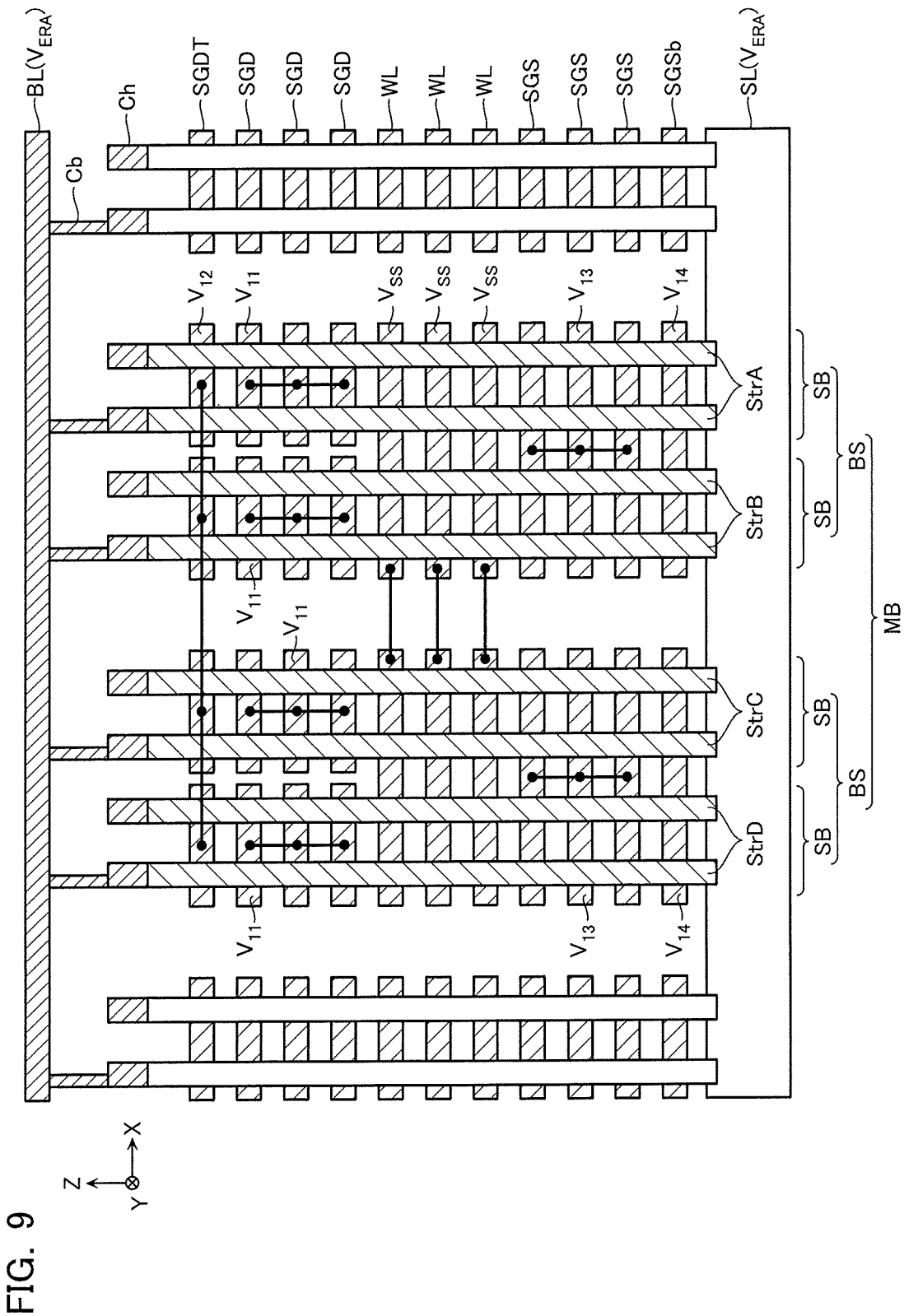
FIG. 9 is a schematic cross-sectional view for describing an erase operation.

FIG. 9 is a schematic cross-sectional view for describing an erase operation of the semiconductor memory device according to the embodiment.

In the erase operation, for example, the bit line BL and the source line SL are supplied with an erase voltage $V_{ERA}$. The erase voltage $V_{ERA}$ is, for example, larger than the write pass voltage $V_{PASS}$ in FIG. 8.

In the erase operation, for example, all the memory cells MC included in the selected memory block MB are electrically conducted with the bit line BL and the source line SL. For example, all the drain select lines SGD and the source select lines SGS included in the select memory block MB are supplied with voltages $V_{11}$ and $V_{13}$. The voltages $V_{11}$ and $V_{13}$ are, for example, voltages having a magnitude to the extent that a channel of the holes is formed on the surface of the semiconductor layer 120. The voltages $V_{11}$ and $V_{13}$ are smaller than the erase voltage $V_{ERA}$. The voltages $V_{11}$ and $V_{13}$ may, for example, be voltages having identical magnitudes.

In the erase operation, for example, the drain select line SGDT and the source select line SGSb included in the selected memory block MB are supplied with the voltages $V_{12}$ and $V_{14}$. The voltages $V_{12}$ and $V_{14}$ are, for example, voltages having magnitudes to the extent that a Gate Induced Drain Leakage (GIDL) occurs on the surface of the semiconductor layer 120. The voltages $V_{12}$ and $V_{14}$ are smaller than the voltages $V_{11}$ and $V_{13}$.

In the erase operation, for example, all the word lines WL included in the selected memory block MB are supplied with the ground voltage $V_{SS}$. This accumulates the holes on the electric charge accumulating films 132 (FIG. 5) of all the memory cells MC included in the selected memory block MB, and the threshold voltage of the memory cell MC decreases.

Figure 10:
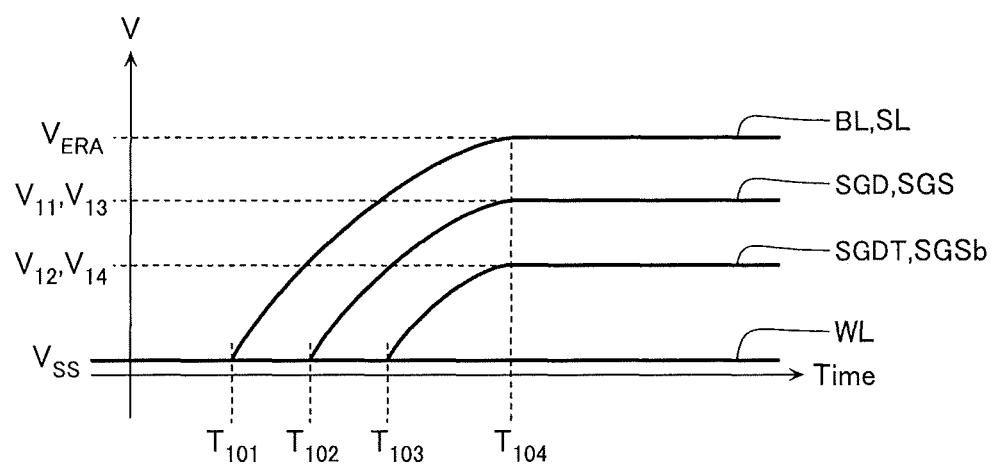
FIG. 10 is a schematic waveform diagram for describing the erase operation.

FIG. 10 is a schematic waveform diagram for describing the erase operation of the semiconductor memory device according to the embodiment.

In the erase operation of the semiconductor memory device according to the embodiment, for example, it is considered to connect the bit line BL and the source line SL to the charge pump circuit 31a (FIG. 1), input the clock signal into this charge pump circuit 31a, and increase the voltage of the operating voltage output terminal to the extent of the erase voltage $V_{ERA}$. It is also considered to connect the select gate lines (SGDT, SGD, SGS, SGSb) to the regulator circuit 31b (FIG. 1) and supply the above-described voltages $V_{11}$, $V_{12}$, $V_{13}$, and $V_{14}$. It is also considered to connect the word line WL to a pad electrode or the like (not illustrated) to supply the above-described ground voltage $V_{SS}$. FIG. 10 exemplarily illustrates waveforms in the erase operation performed in such an aspect.

At a timing $T_{101}$, all the voltages of the bit line BL, the drain select line SGDT, and the drain select line SGD are voltages to the extent of approximately the ground voltage $V_{SS}$. From the timing $T_{101}$ to a timing $T_{102}$, the voltage of the bit line BL increases to a predetermined magnitude (for example, approximately 8 V).

At the timing $T_{102}$, a voltage difference between the bit line BL and the drain select line SGD becomes a predetermined magnitude (for example, approximately 8 V). From the timing $T_{102}$ to a timing $T_{103}$, the voltage of the bit line BL further increases. The voltage of the drain select line SGD also increases. From the timing $T_{102}$ to a timing $T_{103}$, the voltage difference between the bit line BL and the drain select line SGD is approximately maintained to the predetermined magnitude (for example, approximately 8 V).

Even at the timing $T_{103}$, the voltage difference between the bit line BL and the drain select line SGD is the predetermined magnitude (for example, approximately 8 V). At the timing $T_{103}$, a voltage difference between the drain select line SGD and the drain select line SGDT becomes a predetermined magnitude (for example, approximately 8 V). From the timing $T_{103}$ to the timing $T_{104}$, the voltage of the bit line BL further increases. The voltage of the drain select line SGD also further increases. The voltage of the drain select line SGDT also increases. From the timing $T_{103}$ to the timing $T_{104}$, the voltage difference between the bit line BL and the drain select line SGD and the voltage difference between the drain select line SGD and the drain select line SGDT are approximately maintained to be the predetermined magnitudes (for example, approximately 8 V) for predetermined durations. The voltage difference between the bit line BL and the drain select line SGD may be identical to and may be different from the voltage difference between the drain select line SGD and the drain select line SGDT.

At the timing $T_{104}$, the voltage of the bit line BL reaches the erase voltage $V_{ERA}$ (FIG. 9). The voltage of the drain select line SGD reaches the above-described voltage $V_{11}$ (FIG. 9). The voltage of the drain select line SGD reaches the above-described voltage $V_{12}$ (FIG. 9).

As illustrated in FIG. 10, the voltage of the source line SL may be controlled similarly to the voltage of the bit line BL. The voltage of the source select line SGS may be controlled similarly to the voltage of the drain select line SGD. The voltage of the source select line SGSb may be controlled similarly to the voltage of the drain select line SGDT.

Effects

As described with reference to FIG. 9, in this embodiment, the holes are generated by GIDL in the erase operation. In such a case, the larger the voltage difference between the gate and the channel of a transistor is, the higher the generating speed of the holes can get, thereby ensuring increasing the speed of the erase operation. However, for example, when the voltage difference between the drain select line SGD and the semiconductor layer 120 is made too large, the holes are accumulated on the electric charge accumulating film 132 included in the gate insulating film 130 of the drain select line SGD, and there sometimes is a case where the threshold voltage of the drain select transistor STD varies. In such a case, there sometimes is a case where the drain select transistor STD cannot be preferably controlled.

Therefore, in this embodiment, there is disposed the drain select line SGDT used to generate the GIDL in the erase operation in addition to the drain select line SGD used to select the memory string MS. In the erase operation, the voltage to the extent that does not cause the variation of the threshold voltage is supplied to the drain select line SGD, and the voltage that generates the holes at high speed is supplied to the drain select line SGDT. This ensures achieving the semiconductor memory device that is configured to execute the erase operation at high speed while reducing a malfunction.

As described with reference to FIG. 10, in this embodiment, the voltages of the bit line BL, the drain select line SGD, and the drain select line SGDT sequentially rise while maintaining the predetermined voltage differences. In such an aspect, since the voltage difference between the semiconductor layer 120 and the drain select line SGD is maintained to be a constant magnitude, therefore, the variation of the threshold voltage of the drain select line SGD can be preferably reduced.

As described with reference to FIG. 6, in this embodiment, the plurality of conducting layers 110 that function as the drain select line SGDT are electrically connected to one another. In such a configuration, for example, compared with a case where the four drain select lines SGDT included in one memory block MB are separately controlled, a circuit area can be decreased.

Second Embodiment

Next, with reference to FIG. 11 and FIG. 12, a semiconductor memory device according to a second embodiment will be described.

Figure 11:
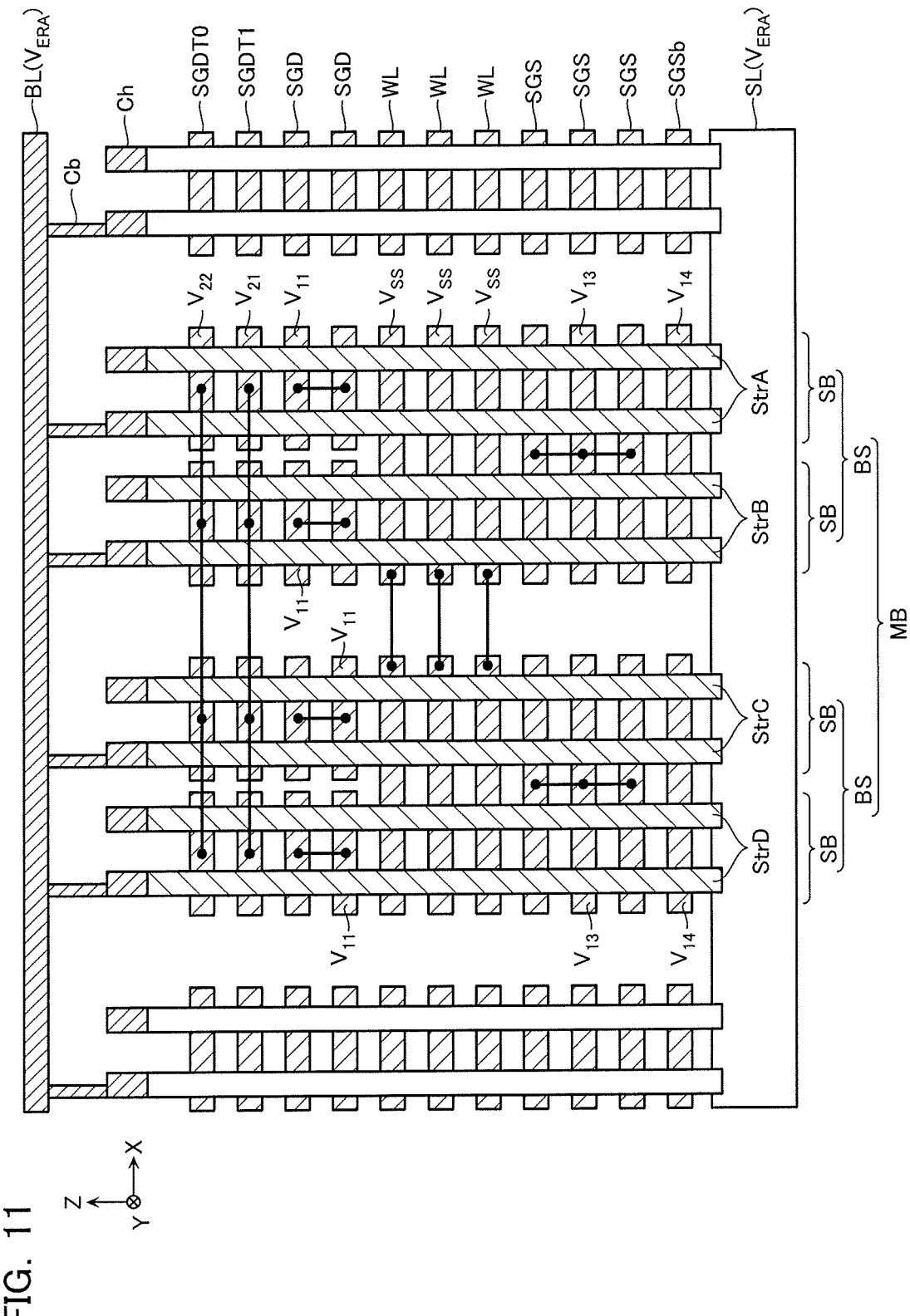
FIG. 11 is a schematic cross-sectional view for describing a semiconductor memory device according to a second embodiment.

FIG. 11 is a schematic cross-sectional view of the semiconductor memory device according to the embodiment. The semiconductor memory device according to the embodiment is basically configured similarly to the semiconductor memory device according to the first embodiment. However, in the second embodiment, as illustrated in FIG. 11, there are disposed two drain select lines SGDT 1 and SGDT 0 arranged in the Z direction as the drain select line SGDT. These two drain select lines SGDT 1 and SGDT 0 are electrically insulated from one another.

Figure 12:
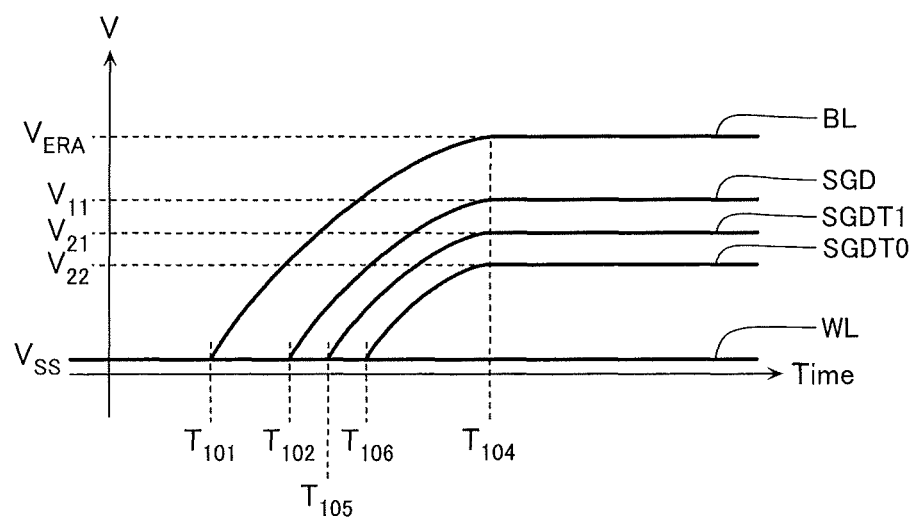
FIG. 12 is a schematic waveform diagram for describing an erase operation.

FIG. 12 is a schematic waveform diagram for describing an erase operation according to the embodiment. The erase operation according to the embodiment is basically executed similarly to the erase operation according to the first embodiment. However, in this embodiment, as illustrated in FIG. 12, a timing $T_{105}$ at which a voltage of the drain select line SGDT 1 starts to increase and a timing $T_{106}$ at which a voltage of the drain select line SGDT 0 starts to increase are different from one another. The magnitudes of the voltages supplied to these drain select lines SGDT 1 and SGDT 0 are also different from one another. Such a behavior can be achieved, for example, by making a difference between the magnitudes of voltages of an output voltage of the regulator circuit 31b (FIG. 1) connected to the drain select line SGDT 1 and an output voltage of the regulator circuit 31b (FIG. 1) connected to the drain select line SGDT 0.

Here, in order to preferably generate the holes by GIDL, it is preferred that the boundary portion between the impurity region 123 (FIG. 4) and the non-dope region 124 (FIG. 4) of the semiconductor layer 120 is opposed to the conducting layer 110 functioning as the drain select line SGDT. However, adjusting a position in the Z direction of the boundary portion between the impurity region 123 and the non-dope region 124 is sometimes difficult.

Therefore, in this embodiment, as described with reference to FIG. 11, the two drain select lines SGDT 1 and SGDT 0 arranged in the Z direction are configured to be independently controllable. In such a configuration, even if the position of the boundary portion between the impurity region 123 and the non-dope region 124 is varied, adjusting the voltages of the drain select lines SGDT 1 and SGDT 0 ensures achieving the semiconductor memory device that is configured to execute the erase operation at high speed while reducing the malfunction.

Third Embodiment

[Configuration]
Next, with reference to FIG. 13, a configuration of a semiconductor memory device according to a third embodiment will be described.

Figure 13:
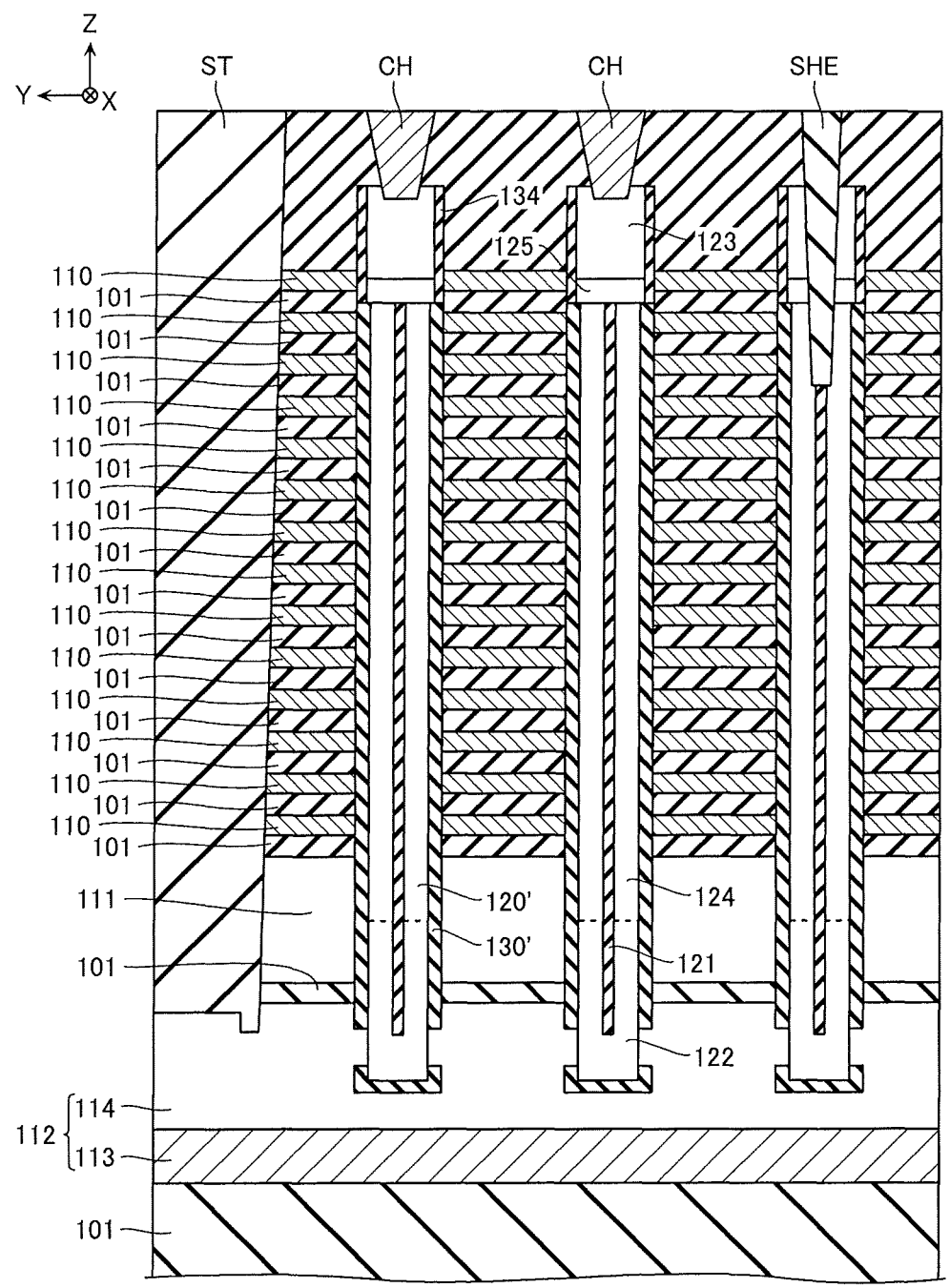
FIG. 13 is a schematic cross-sectional view for describing a semiconductor memory device according to a third embodiment.

FIG. 13 is a schematic cross-sectional view of the semiconductor memory device according to the embodiment. The semiconductor memory device according to the embodiment is basically configured similarly to the semiconductor memory device according to the first embodiment.

However, a semiconductor layer 120' according to the embodiment is different from the semiconductor layer 120 (FIG. 4), and includes a non-dope region 125 disposed between the impurity region 123 and the non-dope region 124. The impurity concentration of N-type impurities in the non-dope region 125 is smaller than the impurity concentrations of N-type impurities in the impurity regions 122 and 123. The non-dope region 125 has a lower surface disposed lower than the lower surface of the conducting layer 110 functioning as the drain select line SGDT, and is connected to the top surfaces of the non-dope region 124 and the insulating film 121. The non-dope region 125 has atop surface disposed between the lower surface and the top surface of the conducting layer 110 functioning as the drain select line SGDT in the Z direction, and is connected to the lower surface of the impurity region 123. In this embodiment, the conducting layer 110 functioning as the drain select line SGDT is opposed to both the non-dope region 125 and the impurity region 123.

A gate insulating film 130' according to the embodiment includes the tunnel insulating film 131, the electric charge accumulating film 132, and the block insulating film 133 including upper ends disposed to a height of the lower surface of the non-dope region 125. The gate insulating film 130' according to the embodiment includes agate insulating film 134 of silicon oxide ($SiO_2$) or the like disposed between the non-dope region 125 and the conducting layer 110 and between the impurity region 123 and the conducting layer 110. The gate insulating film 134 is connected to at least one of the upper ends of the tunnel insulating film 131, the electric charge accumulating film 132, and the block insulating film 133 at its lower end. The gate insulating film 134 functions as the gate insulating film of the drain select transistor STDT. The gate insulating film 134 does not include the electric charge accumulating film and the like.

[Manufacturing Method]

Next, with reference to FIG. 14 to FIG. 28, a method for manufacturing the drain select transistor STDT according to the embodiment will be briefly described. FIG. 14 to FIG. 28 are schematic cross-sectional views for describing the manufacturing method.

Figure 14:
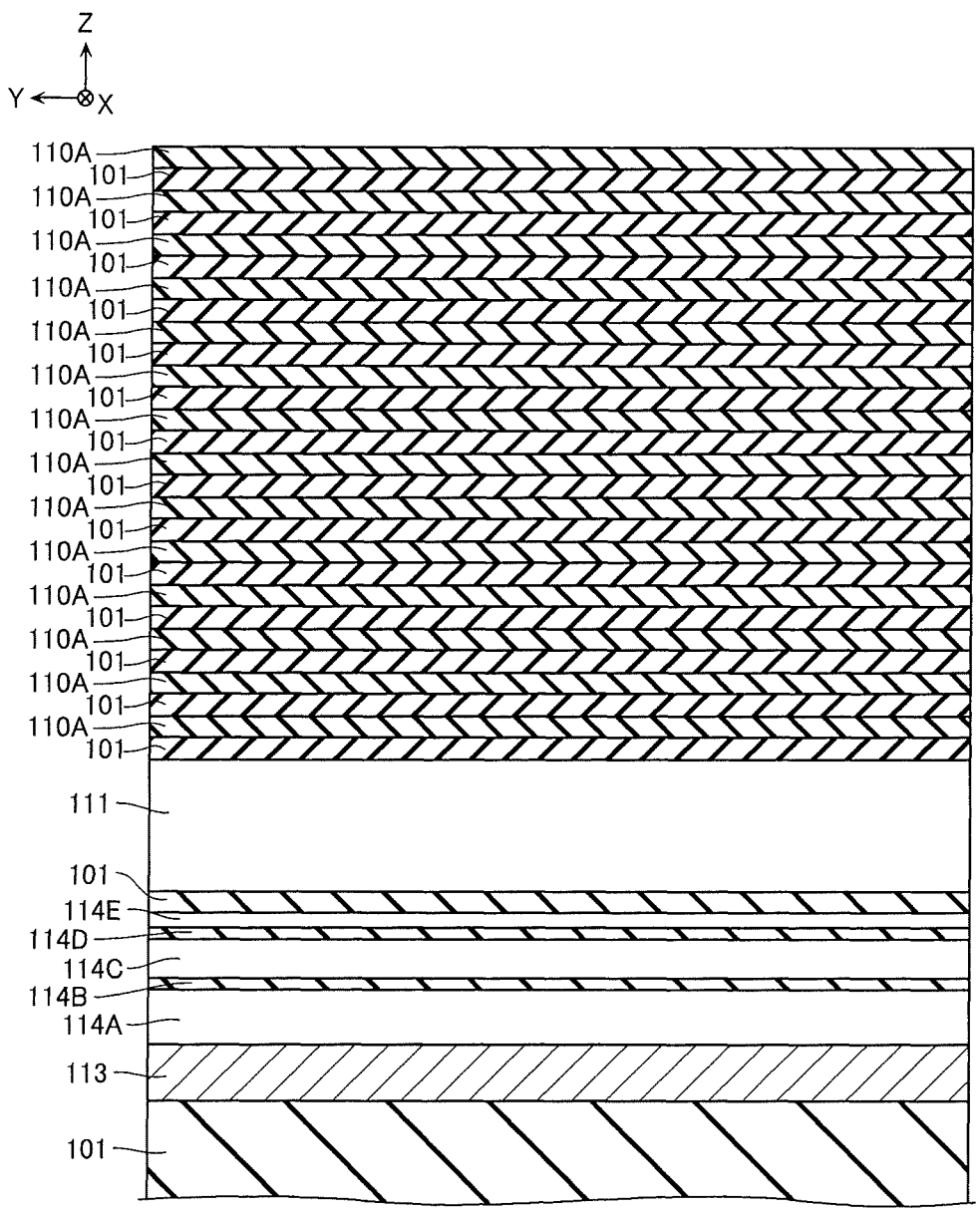
FIG. 14 is a schematic cross-sectional view for describing a method for manufacturing the semiconductor memory device.

In the manufacturing method, for example, as illustrated in FIG. 14, the conducting layer 113, a semiconductor layer 114A of silicon or the like, a sacrificial layer 114B of silicon oxide or the like, a sacrificial layer 114C of silicon or the like, a sacrificial layer 114D of silicon oxide or the like, a semiconductor layer 114E of silicon or the like, the insulating layer 101, and the conducting layer 111 are formed on the insulating layer 101. The plurality of insulating layers 101 and a plurality of sacrificial layers 110A are alternately formed. This process is, for example, performed by a method such as Chemical Vapor Deposition (CVD).

Figure 15:
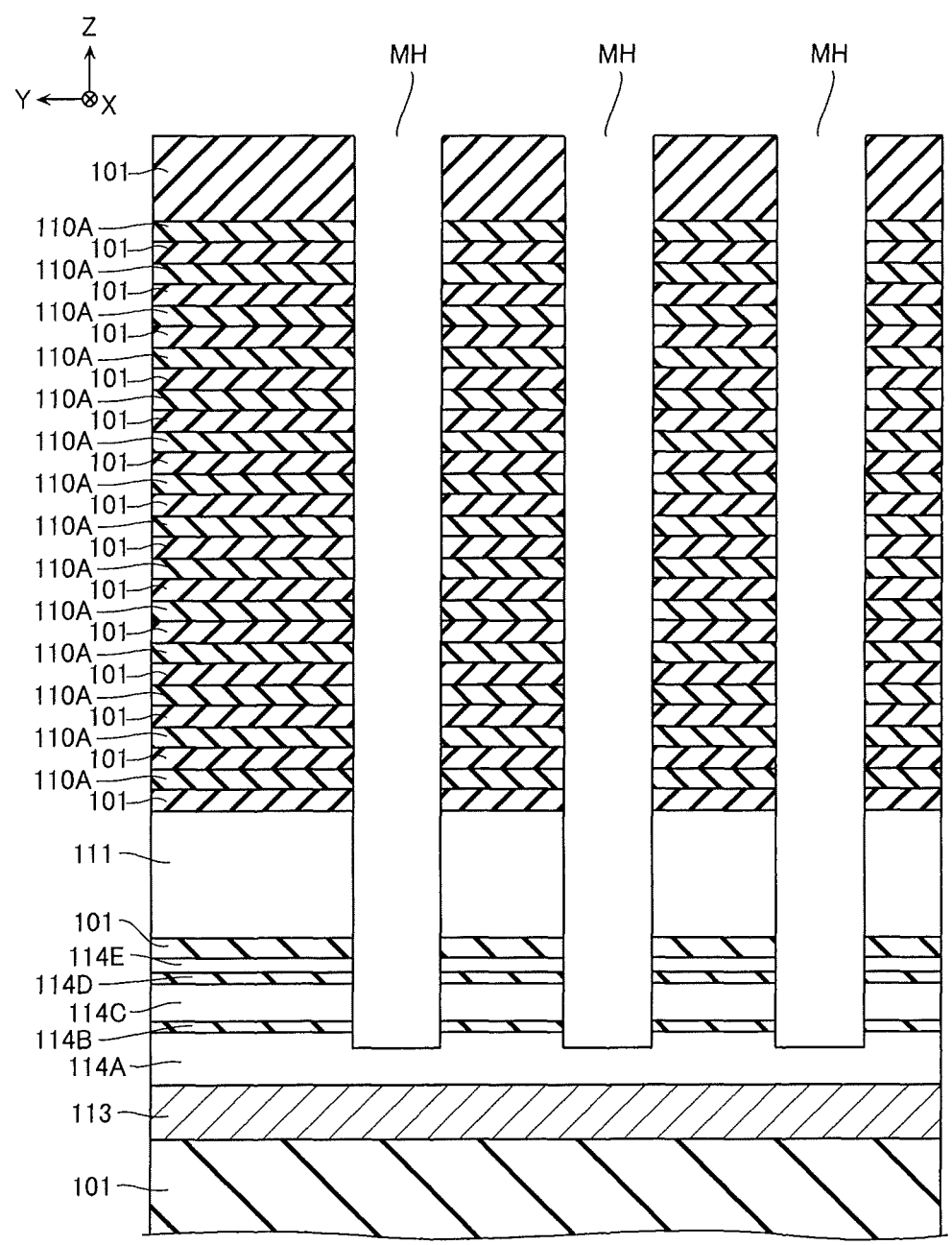
FIG. 15 is a schematic cross-sectional view for describing the manufacturing method.

Next, for example, as illustrated in FIG. 15, openings MH is formed. The openings MH pass through the plurality of insulating layers 101 and the plurality of sacrificial layers 110A, the conducting layer 111, the semiconductor layer 114E, the sacrificial layer 114D, the sacrificial layer 114C, and the sacrificial layer 114B to extend in the Z direction. This process is, for example, performed by a method such as Reactive Ion Etching (RIE).

Figure 16:
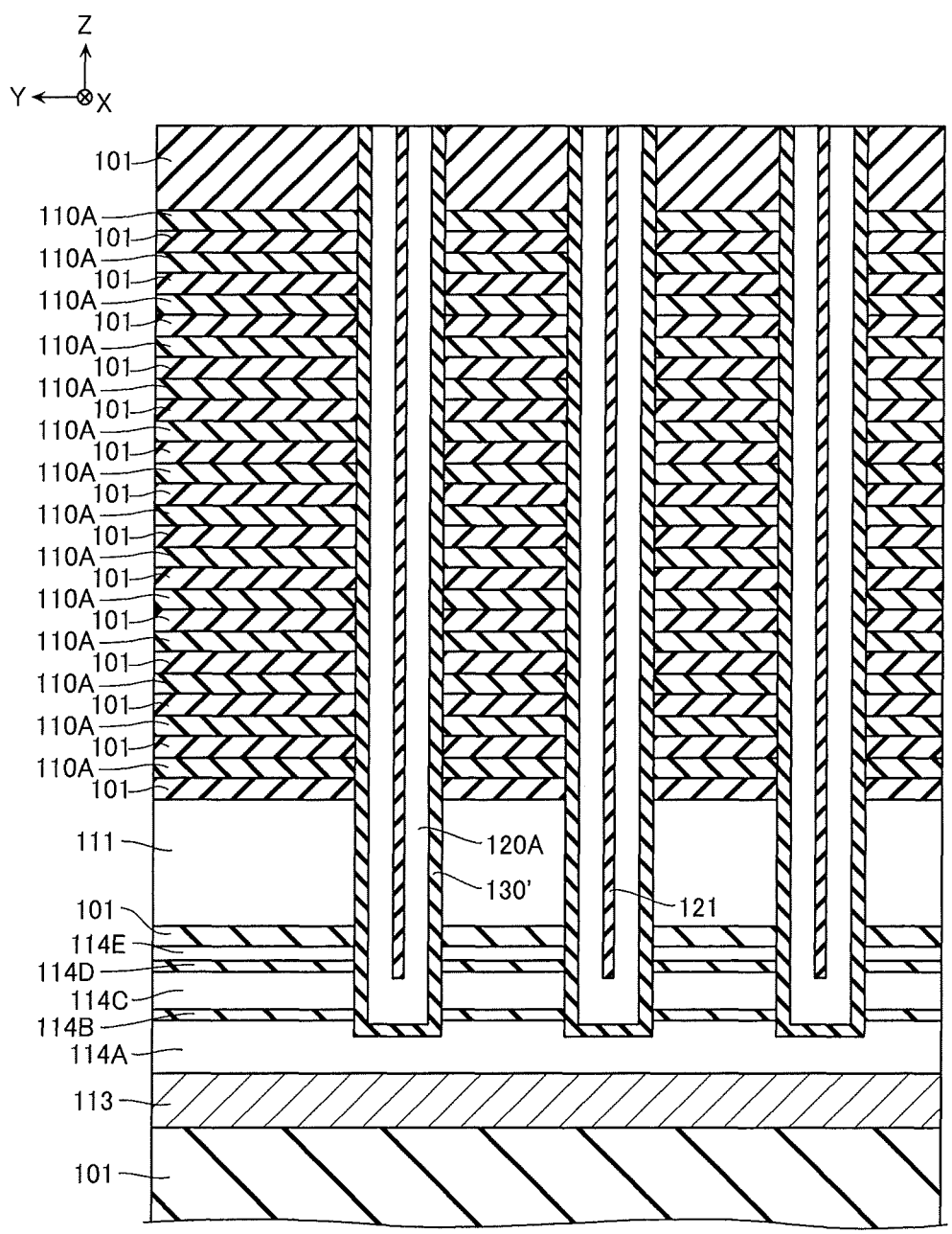
FIG. 16 is a schematic cross-sectional view for describing the manufacturing method.

Next, for example, as illustrated in FIG. 16, inside the openings MH, the gate insulating films 130', semiconductor layers 120A, and the insulating films 121 are formed. This process is, for example, performed by a method such as film formation by CVD and etchback by RIE.

Figure 17:
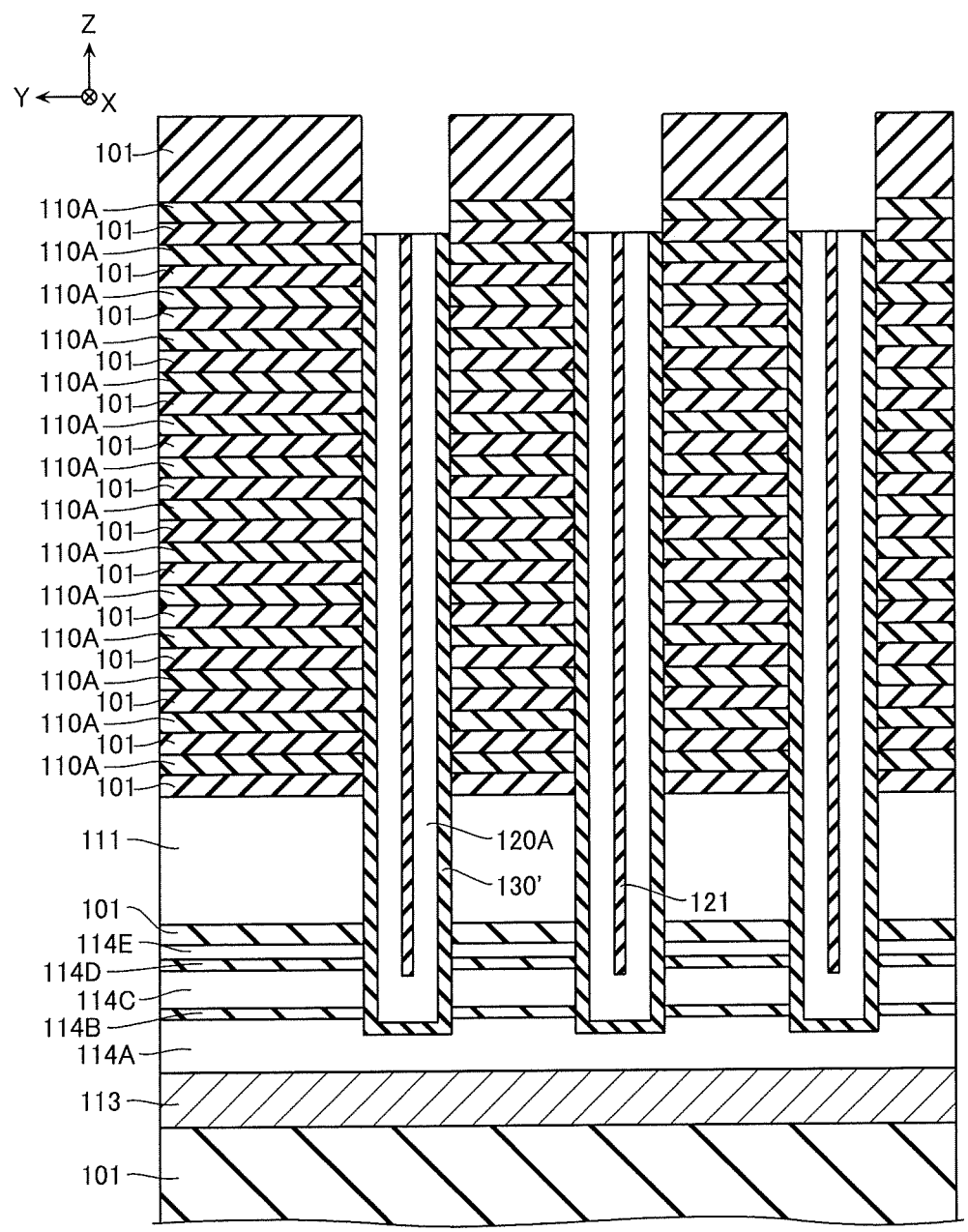
FIG. 17 is a schematic cross-sectional view for describing the manufacturing method.

Next, for example, as illustrated in FIG. 17, parts of the gate insulating films 130', the semiconductor layers 120A, and the insulating films 121 are removed. This process is, for example, performed such that the upper ends of the gate insulating films 130', the semiconductor layers 120A, and the insulating films 121 are positioned lower than a lower surface of the uppermost sacrificial layer 110A among the plurality of sacrificial layers 110A arranged in the Z direction. This process is, for example, performed by a method such as RIE.

Figure 18:
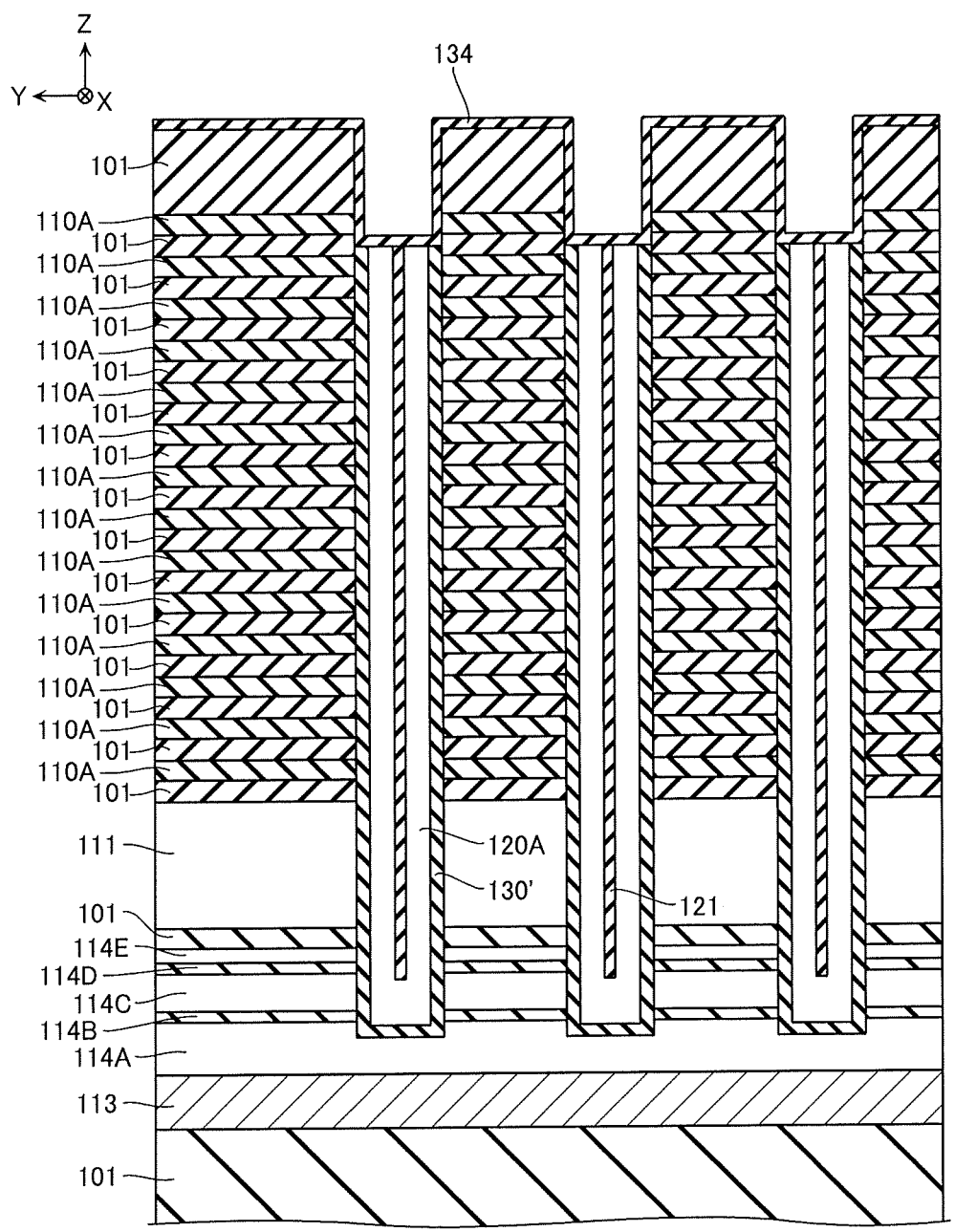
FIG. 18 is a schematic cross-sectional view for describing the manufacturing method.

Next, for example, as illustrated in FIG. 18, the gate insulating film 134 is formed on inner peripheral surfaces of the insulating layers 101 and the uppermost sacrificial layer 110A, and upper ends of the gate insulating films 130', the semiconductor layers 120A, and the insulating films 121. This process is, for example, performed by a method such as CVD.

Figure 19:
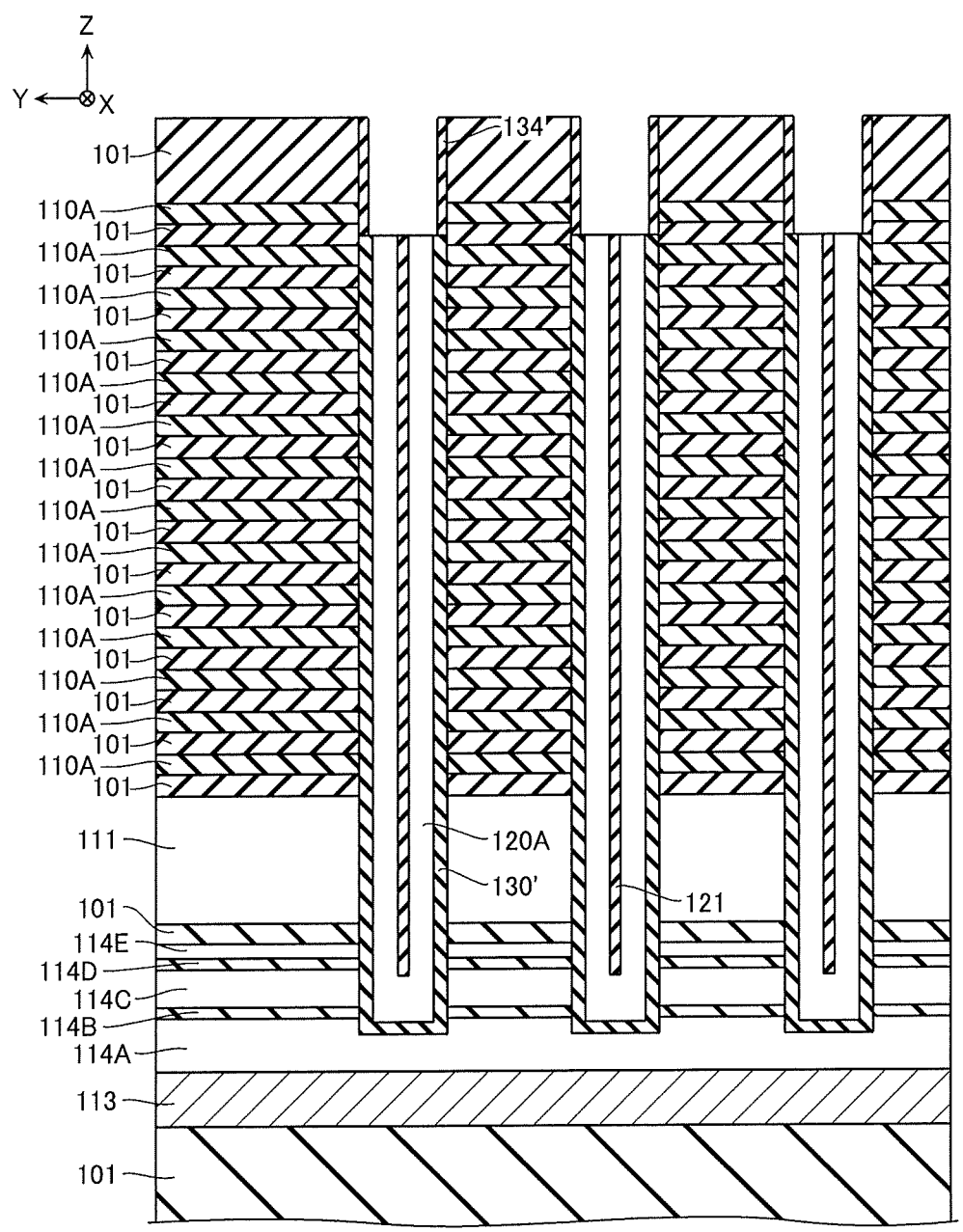
FIG. 19 is a schematic cross-sectional view for describing the manufacturing method.

Next, for example, as illustrated in FIG. 19, parts of the gate insulating film 134 disposed on the upper ends of the semiconductor layers 120A and the insulating films 121 are removed. This process is, for example, performed such that the upper ends of the semiconductor layers 120A are exposed. This process is, for example, performed by a method such as RIE.

Figure 20:
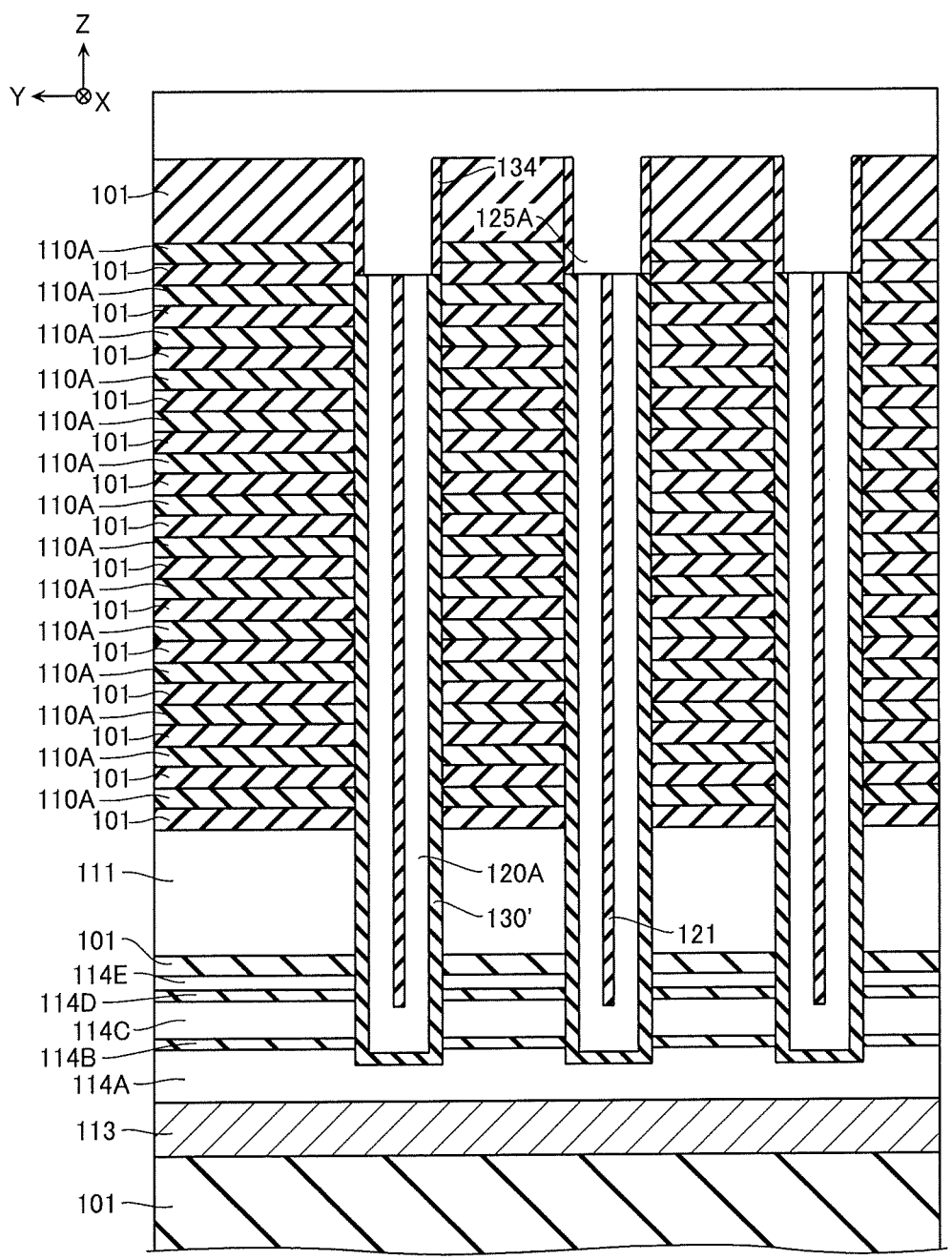
FIG. 20 is a schematic cross-sectional view for describing the manufacturing method.

Next, for example, as illustrated in FIG. 20, a semiconductor layer 125A is formed on the upper ends of the semiconductor layers 120A and the insulating films 121, and the inner peripheral surfaces of the gate insulating films 134. The semiconductor layer 125A is, for example, amorphous silicon or the like that does not contain impurities. This process is, for example, performed by a method such as CVD.

Figure 21:
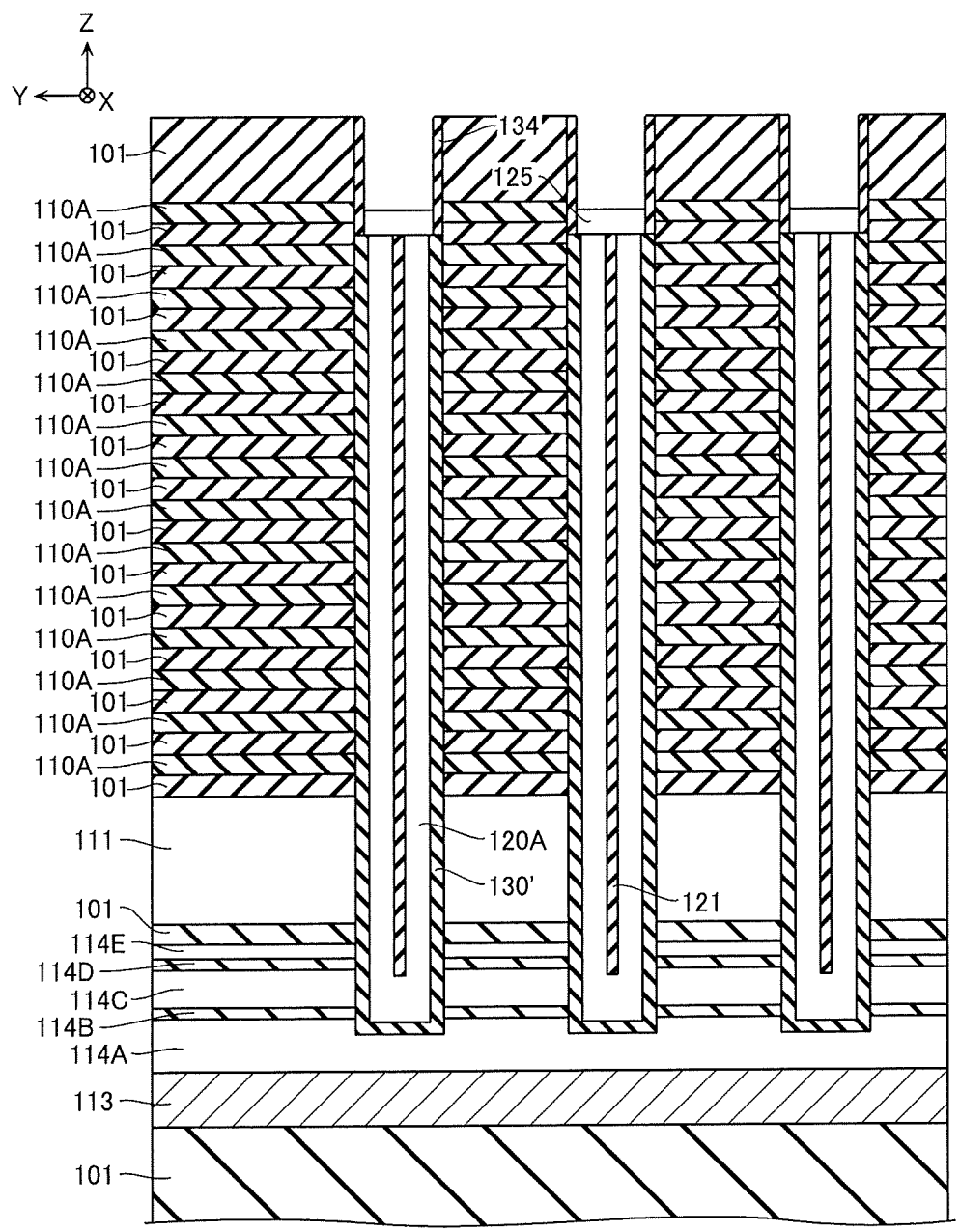
FIG. 21 is a schematic cross-sectional view for describing the manufacturing method.

Next, for example, as illustrated in FIG. 21, a part of the semiconductor layer 125A is removed to form the non-dope region 125 of the semiconductor layer 120'. This process is, for example, performed such that a top surface of the semiconductor layer 125A is positioned upper than the lower surface of the uppermost sacrificial layer 110A among the plurality of sacrificial layers 110A arranged in the Z direction and positioned lower than the top surface of the uppermost sacrificial layer 110A. This process is, for example, performed by a method such as RIE.

Figure 22:
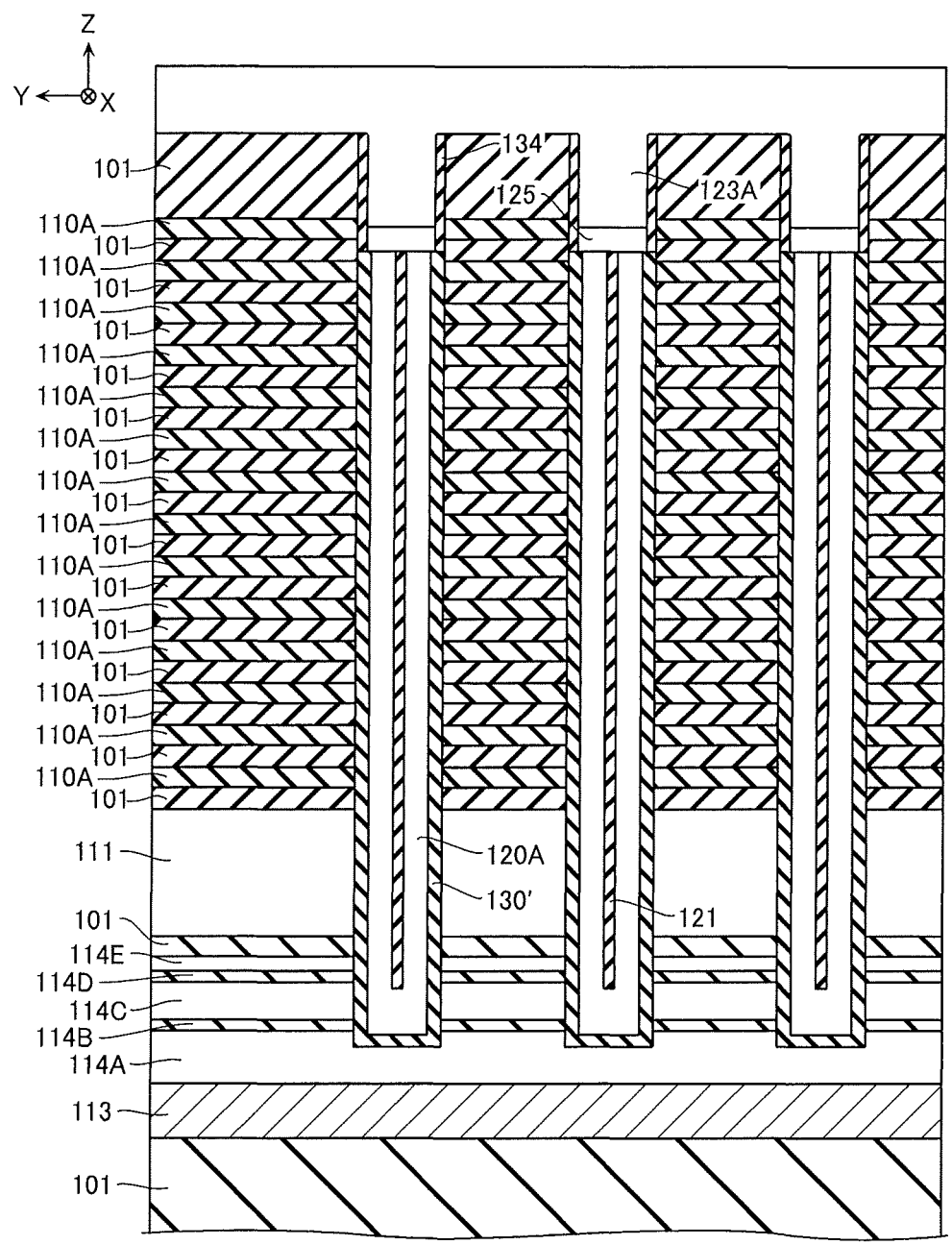
FIG. 22 is a schematic cross-sectional view for describing the manufacturing method.

Next, for example, as illustrated in FIG. 22, a semiconductor layer 123A is formed on the top surfaces of the non-dope regions 125 and the inner peripheral surfaces of the gate insulating films 134. The semiconductor layer 123A is, for example, amorphous silicon or the like containing N-type impurities such as phosphorus (P) and the like. This process is for example, performed by a method such as CVD.

Figure 23:
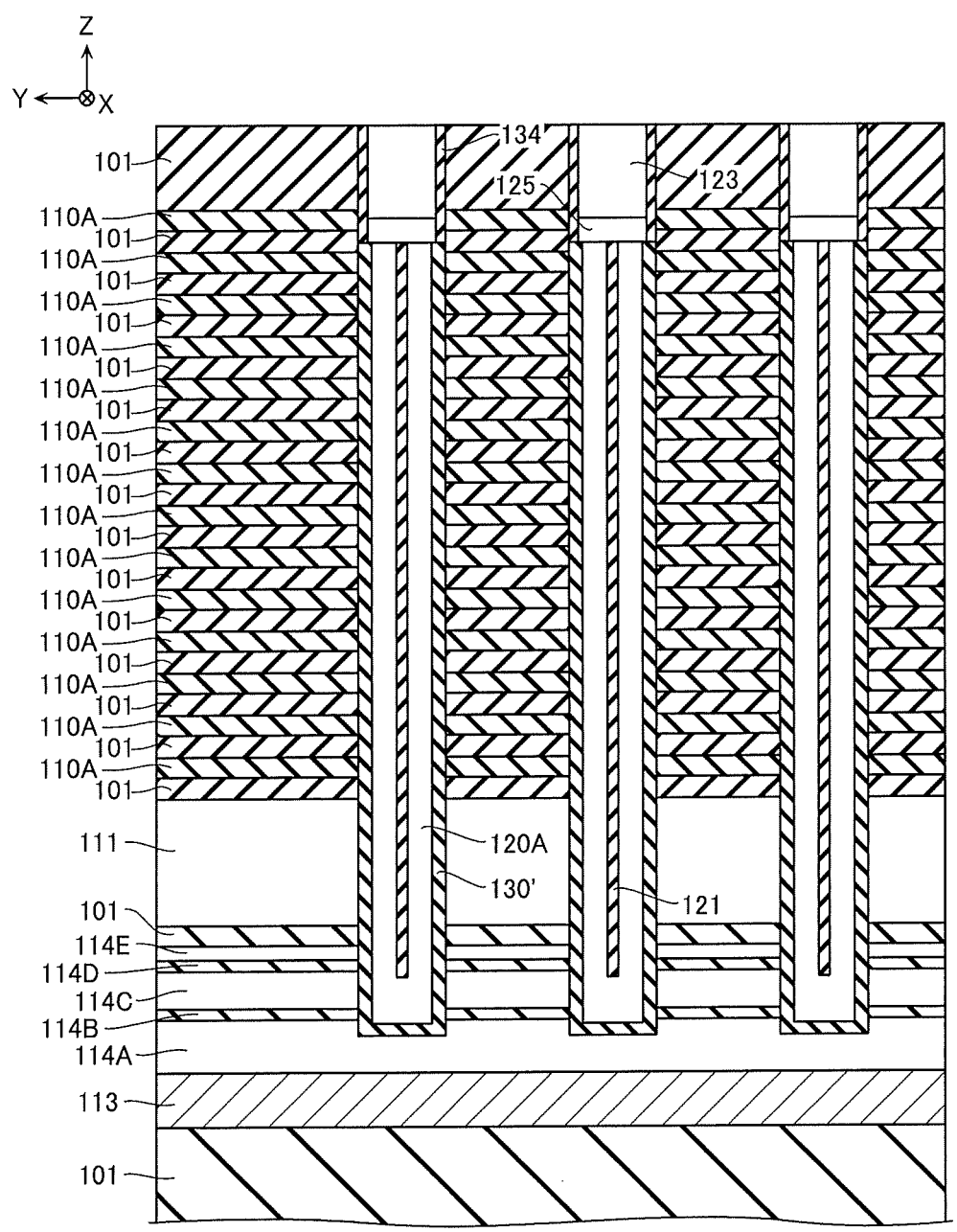
FIG. 23 is a schematic cross-sectional view for describing the manufacturing method.

Next, for example, as illustrated in FIG. 23, a part of the semiconductor layer 123A is removed to form the impurity regions 123 of the semiconductor layers 120'. This process is, for example, performed by a method such as Chemical Mechanical Polishing (CMP).

Figure 24:
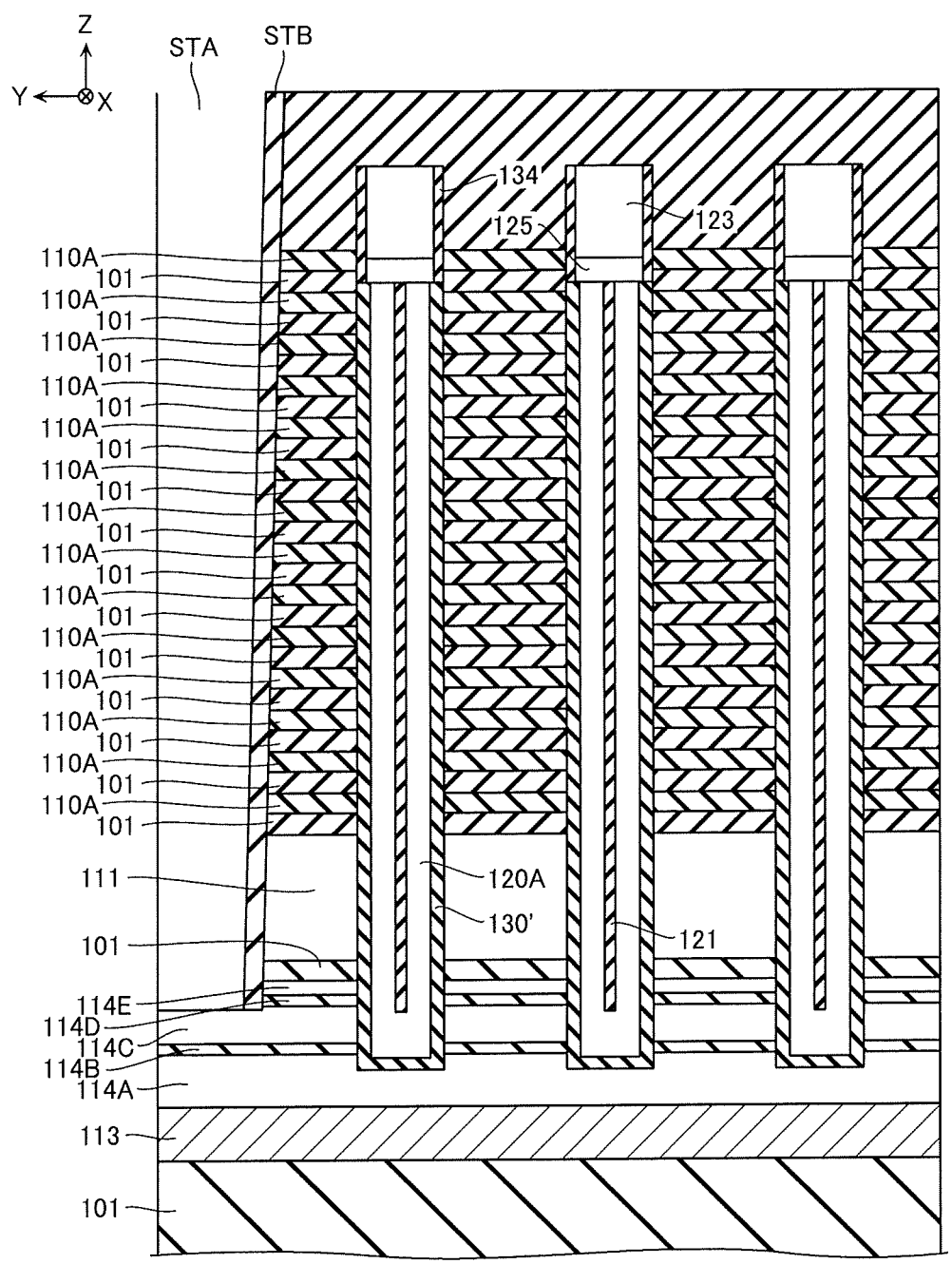
FIG. 24 is a schematic cross-sectional view for describing the manufacturing method.

Next, for example, as illustrated in FIG. 24, an opening STA is formed. The opening STA passes through the plurality of insulating layers 101 and the plurality of sacrificial layers 110A, the conducting layer 111, the semiconductor layer 114E, and the sacrificial layer 114D to extend in the X direction and the Z direction. This process is, for example, performed by a method such as RIE. A protective coat STB of silicon nitride or the like is formed on the side surfaces of the opening STA in the Y direction by a method such as CVD and RIE.

Figure 25:
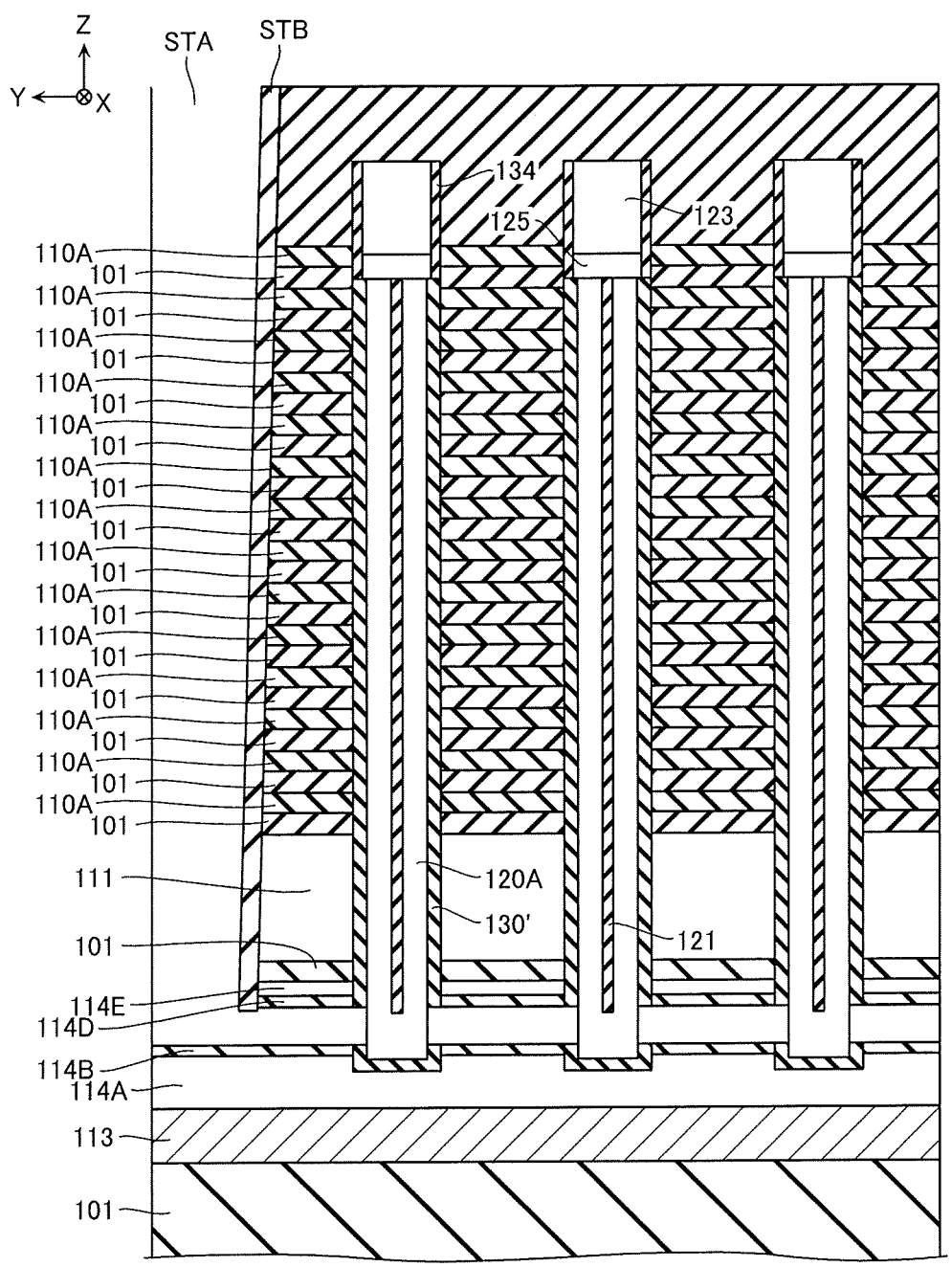
FIG. 25 is a schematic cross-sectional view for describing the manufacturing method.

Next, for example, as illustrated in FIG. 25, the sacrificial layer 114C and parts of the gate insulating films 130' are removed. This process is, for example, performed by a method such as wet etching.

Figure 26:
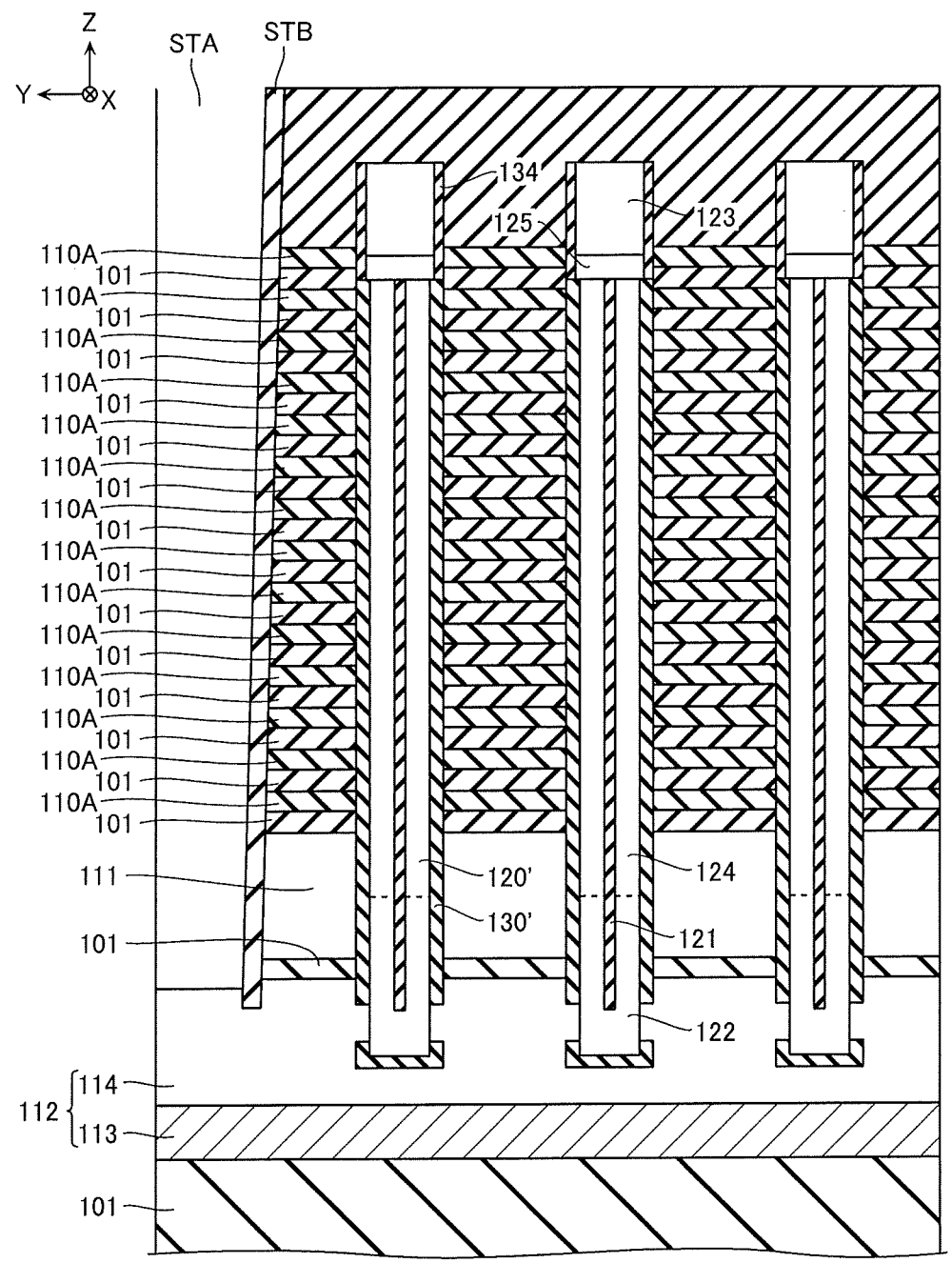
FIG. 26 is a schematic cross-sectional view for describing the manufacturing method.

Next, for example, as illustrated in FIG. 26, the conducting layer 114 is formed. For example, the sacrificial layer 114B and the sacrificial layer 114D are removed by a method such as wet etching, and silicon containing impurities of phosphorus and the like is formed by a method such as CVD.

Figure 27:
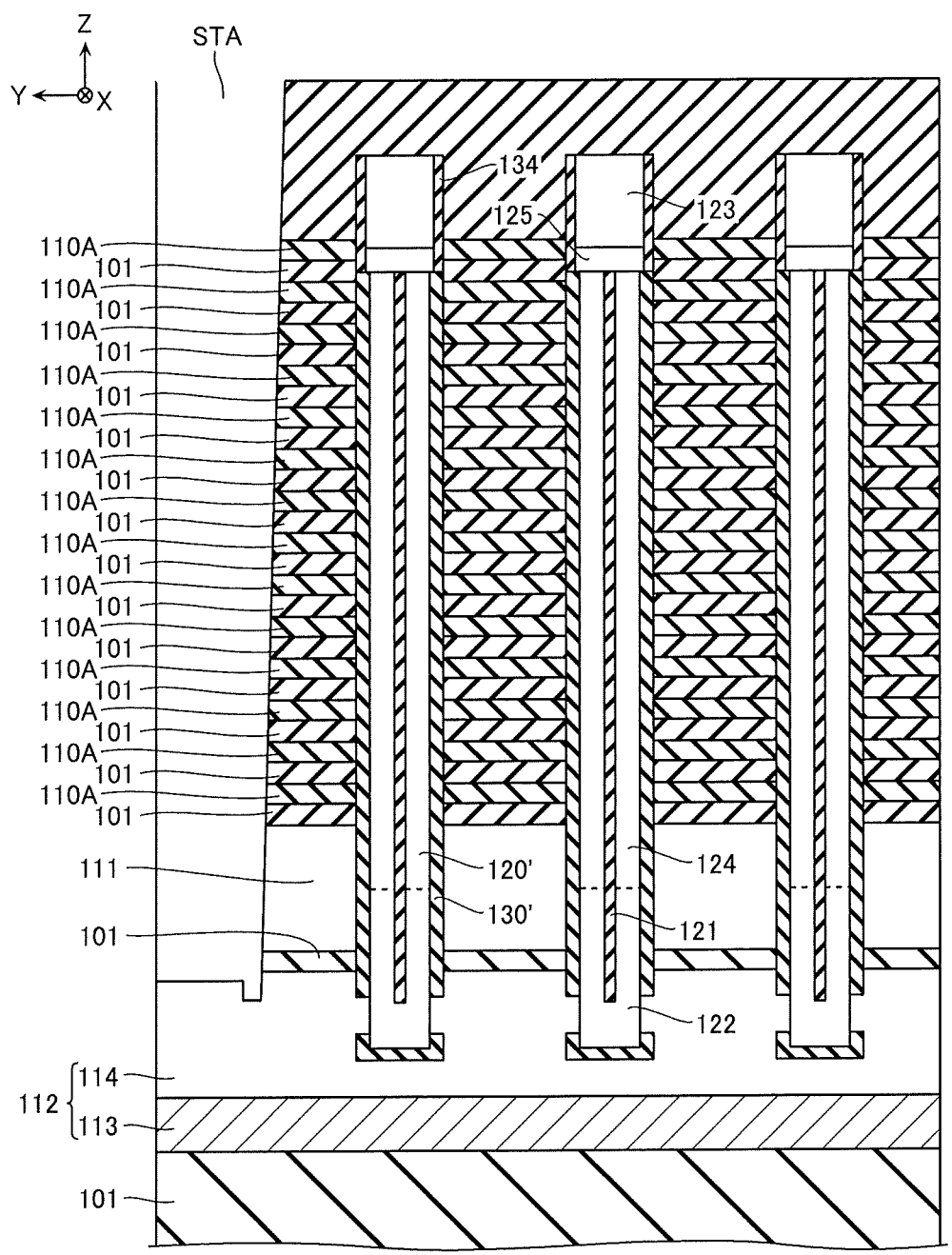
FIG. 27 is a schematic cross-sectional view for describing the manufacturing method.

Next, for example, as illustrated in FIG. 27, the protective coat STB is removed. This process is, for example, performed by a method such as wet etching.

Figure 28:
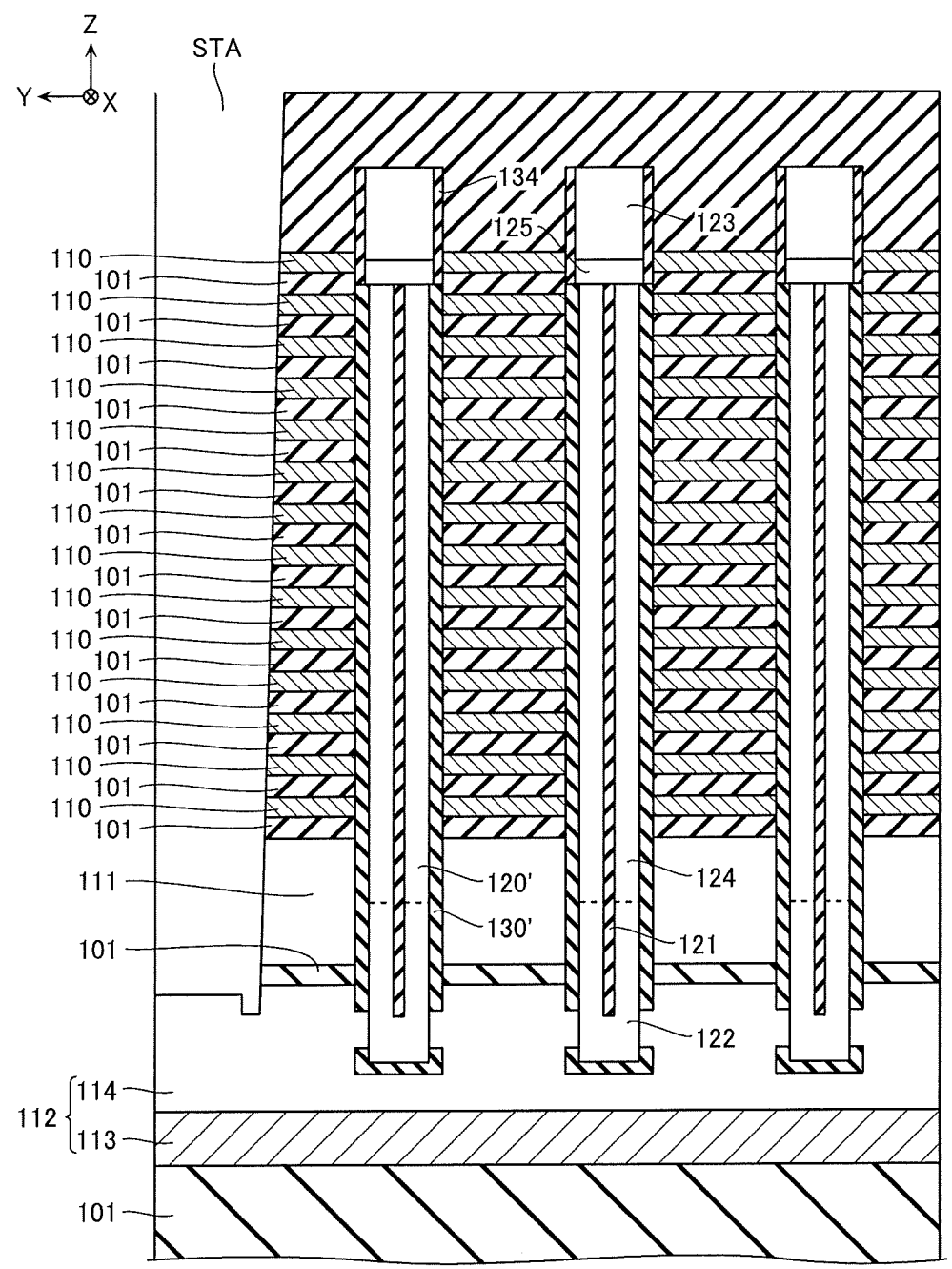
FIG. 28 is a schematic cross-sectional view for describing the manufacturing method; and FIG. 29A to FIG. 29D is a schematic waveform diagram for describing an erase operation of a semiconductor memory device in another embodiment.

Next, for example, as illustrated in FIG. 28, the conducting layers 110 are formed. For example, the sacrificial layers 110A are removed by a method such as wet etching, and tungsten or the like is formed by a method such as CVD.

Then, the inter-block structure insulating layer ST (FIG. 13) is formed inside the opening STA by a method such as CVD, the inter-subblock insulating layer SHE (FIG. 13) is formed by a method such as RIE and CVD, and the contacts CH (FIG. 13) are formed by a method such as RIE and CVD. This forms the structure described with reference to FIG. 13.

Effects

In this embodiment, the gate insulating film 134 of the drain select transistor STDT does not include the electric charge accumulating film. Accordingly, the variation of the threshold of the drain select transistor STDT can be tremendously reduced, thereby ensuring further preferably controlling the erase operation and the like.

In this embodiment, as described with reference to FIG. 21, the position of the top surface of the non-dope region 125 of the semiconductor layer 120' is controllable by processing. Therefore, the position of the boundary portion between the non-dope region 125 and the impurity region 123 described with reference to FIG. 13 is relatively easily adjustable. This ensures further preferably controlling the erase operation and the like.

Other Embodiments

The semiconductor memory device according to the embodiment has been described above. However, the description above is merely an example, and the above-described configuration, method, and the like are adjustable as necessary.

For example, the generation of the holes may be performed by using both the drain select transistor STDT and the source select transistor STSb or may be performed by using one of them.

The behavior described with reference to FIG. 10 can be executed by the combination of the bit line BL, the drain select transistor STD, and the drain select transistor STDT, and also can be executed by the combination of the source line SL, the source select transistor STS, and the source select transistor STSb, as described above.

The behavior illustrated in FIG. 10 is merely an example, and a specific aspect is adjustable as necessary, for example, as exemplarily illustrated in FIG. 29A to FIG. 29D. FIG. 29A to FIG. 29D are schematic waveform diagrams for describing erase operations according to modifications.

Figure 29A:
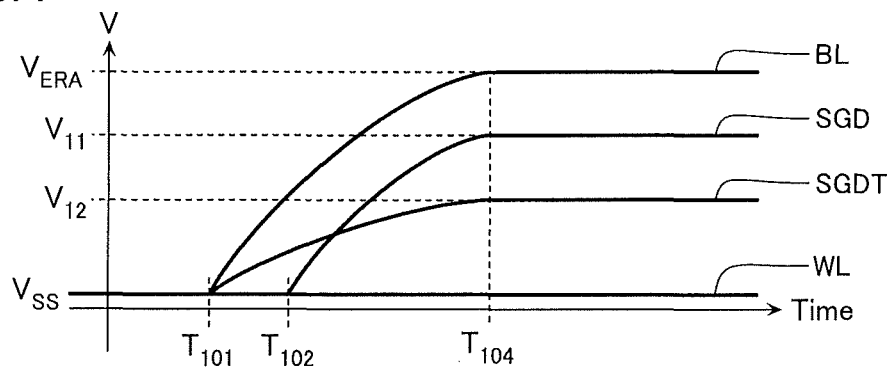

In FIG. 29A, the bit line BL and the drain select line SGDT simultaneously rise from the timing $T_{101}$, and the drain select line SGD rises from the timing $T_{102}$. After the timing $T_{104}$, the voltage difference between the bit line BL and the drain select line SGD and the voltage difference between the drain select line SGD and the drain select line SGDT are each maintained to be approximately constant for a certain period of time. At this time, the voltage of the bit line BL is larger than the voltage of the drain select line SGD, and the voltage of the drain select line SGD is larger than the voltage of the drain select line SGDT.

Figure 29B:
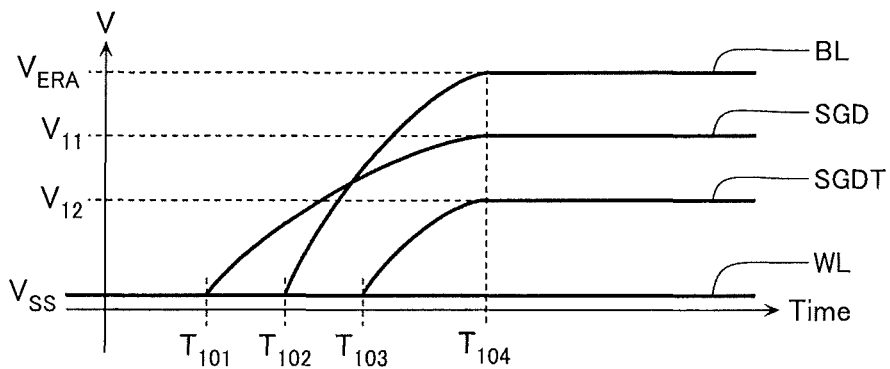

In FIG. 29B, the drain select line SGD rises from the timing $T_{101}$. The bit line BL rises from the timing $T_{102}$. The drain select line SGDT rises from the timing $T_{103}$. After the timing $T_{104}$, the voltage difference between the bit line BL and the drain select line SGD and the voltage difference between the drain select line SGD and the drain select line SGDT are each maintained to be approximately constant for a certain period of time. At this time, the voltage of the bit line BL is larger than the voltage of the drain select line SGD, and the voltage of the drain select line SGD is larger than the voltage of the drain select line SGDT.

Figure 29C:
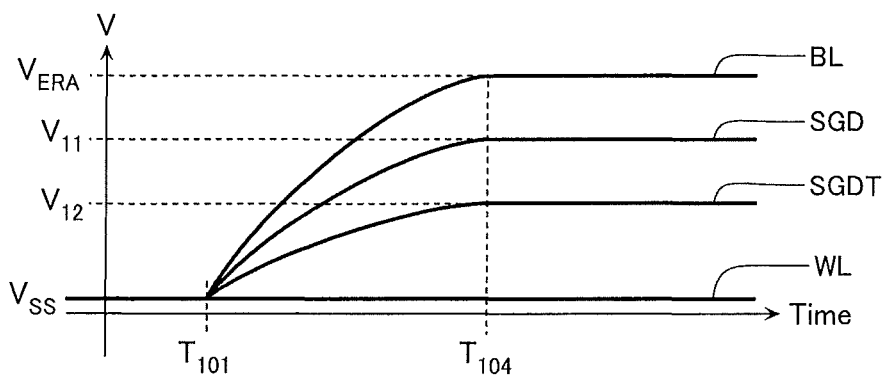

In FIG. 29C, the bit line BL, the drain select line SGDT, and the drain select line SGD simultaneously rise from the timing $T_{101}$. After the timing $T_{104}$, the voltage difference between the bit line BL and the drain select line SGD and the voltage difference between the drain select line SGD and the drain select line SGDT are each maintained to be approximately constant for a certain period of time. At this time, the voltage of the bit line BL is larger than the voltage of the drain select line SGD, and the voltage of the drain select line SGD is larger than the voltage of the drain select line SGDT.

Figure 29D:
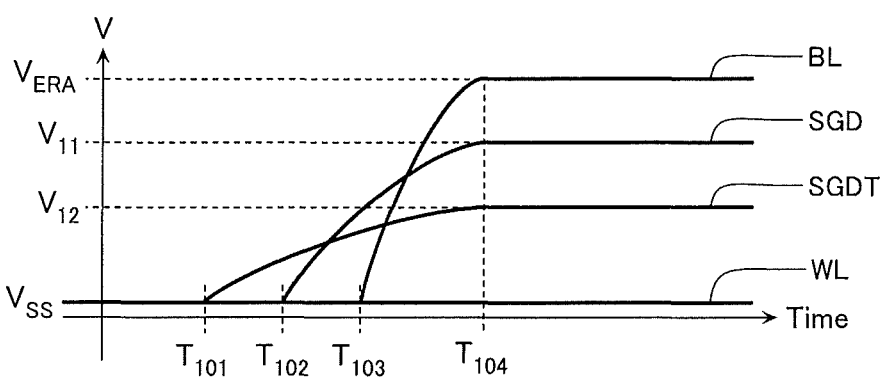

In FIG. 29D, the drain select line SGDT rises from the timing $T_{101}$. The drain select line SGD rises from the timing $T_{102}$. The bit line BL rises from the timing $T_{103}$. After the timing $T_{104}$, the voltage difference between the bit line BL and the drain select line SGD and the voltage difference between the drain select line SGD and the drain select line SGDT are each maintained to be approximately constant for a certain period of time. At this time, the voltage of the bit line BL is larger than the voltage of the drain select line SGD, and the voltage of the drain select line SGD is larger than the voltage of the drain select line SGDT.

In these examples, similarly to the first embodiment to the third embodiment, the voltage difference between the bit line BL and the drain select line SGD and the voltage difference between the drain select line SGD and the drain select line SGDT do not exceed predetermined magnitudes ($V_{ERA}$-$V_{11}$, $V_{11}$-$V_{12}$) and are consequently each maintained to be approximately constant for a certain period of time in the erase operation. At this time, the voltage of the bit line BL is larger than the voltage of the drain select line SGD, and the voltage of the drain select line SGD is larger than the voltage of the drain select line SGDT.

The voltages of the bit line BL, the drain select line SGD, and the drain select line SGDT may be applied directly from the charge pump circuit 31a without the regulator circuit 31b.

The above-described approximately constant may include a case with the presence of electrical fluctuations and noises.

The voltage difference between the bit line BL and the drain select line SGD and the voltage difference between the drain select line SGD and the drain select line SGDT may be identical or may be different.

In the above-described embodiments, in the erase operation, the drain select line SGD is supplied with the voltage to the extent that does not cause the variation of the threshold voltage, and the drain select line SGDT is supplied with the voltage that generates the holes at high speed. This ensures achieving the semiconductor memory device that is configured to execute the erase operation at high speed while reducing the malfunction.

The plurality of conducting layers 110 functioning as the drain select line SGDT are electrically connected to one another. In such a configuration, for example, compared with the case where the four drain select lines SGDT included in one memory block MB are separately controlled, the circuit area can be decreased.

[Others]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a first wiring;
a first memory transistor connected to the first wiring;
a first transistor connected between the first wiring and the first memory transistor;
a second transistor connected between the first wiring and the first transistor;
a second wiring connected to a gate electrode of the first memory transistor;
a third wiring connected to a gate electrode of the first transistor;
a fourth wiring connected to a gate electrode of the second transistor; and
a control circuit configured to execute an erase operation that erases data of the first memory transistor; wherein
from a first timing of the erase operation to a second timing after the first timing, the control circuit:
maintains a voltage difference between the first wiring and the third wiring at a predetermined value;
maintains a voltage difference between the third wiring and the fourth wiring at a predetermined value;
controls a voltage of the first wiring to become larger than a voltage of the third wiring;
controls the voltage of the third wiring to become larger than a voltage of the fourth wiring; and
controls a timing from which the voltage of the third wiring increases from an initial voltage to become different from a timing from which the voltage of the fourth wiring increases from the initial voltage.

2. The semiconductor memory device according to claim 1, wherein
from the first timing of the erase operation to the second timing, the control circuit:
maintains a voltage difference between the fourth wiring and the second wiring at a predetermined value; and
controls the voltage of the fourth wiring to become larger than a voltage of the second wiring.

3. The semiconductor memory device according to claim 1, further comprising:
a third transistor connected between the first transistor and the second transistor; and
a fifth wiring connected to a gate electrode of the third transistor, wherein
from the first timing of the erase operation to the second timing, the control circuit:
maintains a voltage difference between the first wiring and the fifth wiring at a predetermined value;
controls the voltage of the first wiring to become larger than a voltage of the fifth wiring; and
controls the voltage of the fifth wiring to become larger than the voltage of the fourth wiring.

4. The semiconductor memory device according to claim 3, wherein
the fifth wiring is electrically connected to the third wiring.

5. The semiconductor memory device according to claim 1, further comprising:
a fourth transistor connected between the first transistor and the second transistor; and
a sixth wiring connected to a gate electrode of the fourth transistor, wherein
from the first timing of the erase operation to the second timing, the control circuit;
maintains a voltage difference between the third wiring and the sixth wiring at a predetermined value; and
controls the voltage of the third wiring to become larger than a voltage of the sixth wiring.

6. The semiconductor memory device according to claim 5, wherein
from the first timing to the second timing, the voltage of the sixth wiring differs from the voltage of the fourth wiring.

7. The semiconductor memory device according to claim 1, comprising:
a second memory transistor connected to the first wiring;
a fifth transistor connected between the first wiring and the second memory transistor;
a sixth transistor connected between the first wiring and the fifth transistor;
a seventh wiring connected to a gate electrode of the second memory transistor;
an eighth wiring connected to a gate electrode of the fifth transistor; and
a ninth wiring connected to a gate electrode of the sixth transistor.

8. The semiconductor memory device according to claim 7, wherein
the ninth wiring is electrically connected to the fourth wiring.

9. The semiconductor memory device according to claim 1, comprising:
a tenth wiring connected to the first memory transistor;
a seventh transistor connected between the tenth wiring and the first memory transistor;
an eighth transistor connected between the tenth wiring and the seventh transistor;
an eleventh wiring connected to a gate electrode of the seventh transistor; and
a twelfth wiring connected to a gate electrode of the eighth transistor, wherein
from the first timing to the second timing, the control circuit:
maintains a voltage difference between the tenth wiring and the eleventh wiring at a predetermined value;
maintains a voltage difference between the eleventh wiring and the twelfth wiring at a predetermined value;
controls a voltage of the tenth wiring to become larger than a voltage of the eleventh wiring; and
controls a voltage of the eleventh wiring to become larger than a voltage of the twelfth wiring.

10. The semiconductor memory device according to claim 9 wherein
from the first timing to the second timing;
the voltage of the first wiring and the voltage of the tenth wiring are larger than the voltages of the third wiring and the eleventh wiring;
the voltages of the third wiring and the eleventh wiring are larger than the voltages of the fourth wiring and the twelfth wiring; and
the voltages of the fourth wiring and the twelfth wiring are larger than the voltage of the second wiring.

11. The semiconductor memory device according to claim 1, comprising:
a substrate;
a plurality of conducting layers arranged in a first direction intersecting with a surface of the substrate;

a semiconductor layer that extends in the first direction, the semiconductor being opposed to the plurality of conducting layers; and a gate insulating film disposed between the plurality of conducting layers and the semiconductor layer, the gate insulating film including an electric charge accumulating film, wherein the first memory transistor includes a first conducting layer among the plurality of conducting layers, a first region opposed to the first conducting layer of the semiconductor layer, and a part of the electric charge accumulating film disposed between the first conducting layer and the first region, the first transistor includes a second conducting layer farther from the substrate than the first conducting layer among the plurality of conducting layers and a second region opposed to the second conducting layer of the semiconductor layer, and the second transistor includes a third conducting layer farther from the substrate than the second conducting layer among the plurality of conducting layers and a third region opposed to the third conducting layer of the semiconductor layer.

12. The semiconductor memory device according to claim 11, wherein the second transistor includes a fourth region opposed to the third conducting layer of the semiconductor layer, the fourth region of the semiconductor layer is farther from the substrate than the third region of the semiconductor layer, and an impurity concentration of N type impurities in the fourth region of the semiconductor layer is larger than an impurity concentration of N type impurities in the third region of the semiconductor layer.

13. The semiconductor memory device according to claim 11, wherein the first transistor includes a part of the electric charge accumulating film, and the second transistor does not include a part of the electric charge accumulating film.

14. The semiconductor memory device according to claim 11, comprising a first insulating film that extends in the first direction, the first insulating film having an outer peripheral surface surrounded by the semiconductor layer, wherein the third region of the semiconductor layer has a surface connected to one end in the first direction of the second region of the semiconductor layer and one end in the first direction of the first insulating film.

15. A data erase method for a semiconductor memory device, wherein the semiconductor memory device includes:
a first wiring;
a first memory transistor connected to the first wiring;
a first transistor connected between the first wiring and the first memory transistor;
a second transistor connected between the first wiring and the first transistor;
a second wiring connected to a gate electrode of the first memory transistor;
a third wiring connected to a gate electrode of the first transistor;
a fourth wiring connected to a gate electrode of the second transistor; and
a control circuit configured to execute an erase operation that erases data of the first memory transistor, wherein the data erase method comprises, from a first timing of the erase operation to a second timing after the first timing, by the control circuit:
maintaining a voltage difference between the first wiring and the third wiring at a predetermined value,
maintaining a voltage difference between the third wiring and the fourth wiring at a predetermined value,
controlling a voltage of the first wiring to become larger than a voltage of the third wiring;
controlling the voltage of the third wiring to become larger than a voltage of the fourth wiring; and
controlling a timing from which the voltage of the third wiring increases from an initial voltage to become different from a timing from which the voltage of the fourth wiring increases from the initial voltage.

16. The data erase method according to claim 15, comprising from the first timing of the erase operation to the second timing, by the control circuit:
maintaining a voltage difference between the fourth wiring and the second wiring at a predetermined value, and
controlling a voltage of the fourth wiring to become larger than the voltage of the second wiring.

17. The semiconductor memory device according to claim 7, comprising:

a first memory string connected to a first part of the first wiring, the first memory string including the first memory transistor, the first transistor, and the second transistor; and a second memory string connected to a second part different from the first part of the first wiring, the second memory string including the second memory transistor, the fifth transistor, and the sixth transistor, wherein the control circuit is configured to execute an erase operation that erases data of at least one of the first memory transistor and the second memory transistor, a writing operation that writes data to the first memory transistor or the second memory transistor, and a reading operation that reads data from the first memory transistor or the second memory transistor, and at predetermined timings of the writing operation and the reading operation, the voltage of the fourth wiring and a voltage of the ninth wiring become voltages having an identical magnitude.

18. The semiconductor memory device according to claim 17, wherein at the predetermined timings of the writing operation and the reading operation, the voltage of the third wiring and a voltage of the eighth wiring become voltages having different magnitudes.

19. A semiconductor memory device comprising:
a first wiring;
a first memory transistor connected to the first wiring;
a first transistor connected between the first wiring and the first memory transistor;
a second transistor connected between the first wiring and the first transistor;
a second wiring connected to a gate electrode of the first memory transistor;
a third wiring connected to a gate electrode of the first transistor;
a fourth wiring connected to a gate electrode of the second transistor; and a control circuit configured to execute an erase operation that erases data of the first memory transistor; wherein from a first timing of the erase operation to a second timing after the first timing, the control circuit:
- maintains a voltage difference between the first wiring and the third wiring at a predetermined value;
- maintains a voltage difference between the third wiring and the fourth wiring at a predetermined value;
- controls a voltage of the first wiring to become larger than a voltage of the third wiring; and
- controls the voltage of the third wiring to become larger than a voltage of the fourth wiring, wherein the control circuit;

from a third timing prior to the first timing of the erase operation to a fourth timing between the third timing and the first timing, increases the voltage of the first wiring from a first voltage to a second voltage larger than the voltages of the second wiring, the third wiring, and the fourth wiring; and from the fourth timing of the erase operation to a fifth timing between the fourth timing and the first timing, increases the voltage of the first wiring from the second voltage to a third voltage, and increases the voltage of the third wiring from a fourth voltage to a fifth voltage larger than the voltages of the second wiring and the fourth wiring and smaller than the third voltage.

20. The semiconductor memory device according to claim 19, wherein the control circuit;

from the fifth timing of the erase operation to a sixth timing between the fifth timing and the first timing, increases the voltage of the first wiring from the third voltage to a sixth voltage, increases the voltage of the third wiring from the fifth voltage to a seventh voltage larger than the voltages of the second wiring and the fourth wiring and smaller than the sixth voltage, and increases the voltage of the fourth wiring from an eighth voltage to a ninth voltage larger than the voltage of the second wiring and smaller than the seventh voltage.

* * * * *